United States Patent [19]
Furutani

[11] Patent Number: 5,724,366
[45] Date of Patent: Mar. 3, 1998

[54] SEMICONDUCTOR MEMORY DEVICE

[75] Inventor: Kiyohiro Furutani, Tokyo, Japan

[73] Assignee: Mitsubishi Denki Kabushiki Kaisha, Tokyo, Japan

[21] Appl. No.: 738,655

[22] Filed: Oct. 30, 1996

Related U.S. Application Data

[63] Continuation of Ser. No. 551,484, Nov. 1, 1995, Pat. No. 5,642,317.

[30] Foreign Application Priority Data

May 16, 1995 [JP] Japan .................................. 7-117074
May 15, 1996 [JP] Japan .................................. 8-120543

[51] Int. Cl.⁶ ...................................................... G06F 11/00
[52] U.S. Cl. ........................................ 371/21.2; 365/201
[58] Field of Search ............................ 365/201, 189.07, 365/189.05, 225.7; 371/21.1, 21.2, 21.3

[56] References Cited

U.S. PATENT DOCUMENTS 5,555,212  9/1996  Toshiaki et al. ..................... 365/200
5,557,568  9/1996  Miyamoro et al. ................ 365/185.22

OTHER PUBLICATIONS

Takashi Ohsawa, et al., "A 60ns 4Mb CMOS DRAM with Built-in Self-Test", ISSCC Digest of Technical Papers 1987, (pp. 286–287).

Hiroki Koike, et al. "A 30ns 64Mb DRAM with Built-in Self-Test and Repair Function", ISSCC Digest of Technical Papers 1992, (pp. 150–151).

*Primary Examiner*—Vincent P. Canney
*Attorney, Agent, or Firm*—Oblon, Spivak, McClelland, Maier & Neustadt, P.C.

[57] ABSTRACT

The drain electrode of an N type MOSFET (Q16) is connected to a power source potential ($V_{CC}$) through a fuse element (F1) (route cut-off element), and the source electrode is connected to the drain electrode of an N type MOSFET (Q17), and the drain electrode of the N type MOSFET (Q16) is connected to the input of an inverter (G16), and is also connected to a resistance element (R1) connected to a grounding potential ($V_{SS}$). Having this configuration, a semiconductor memory device incorporating a test mechanism is provided in order to test plural semiconductor memory devices by using a tester having a single data judging circuit.

6 Claims, 28 Drawing Sheets

FIG. 9
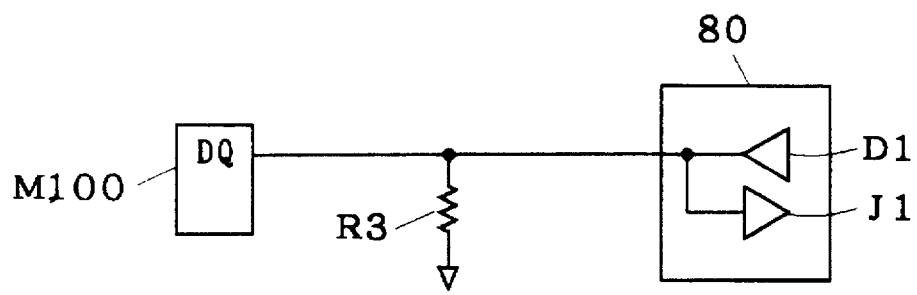
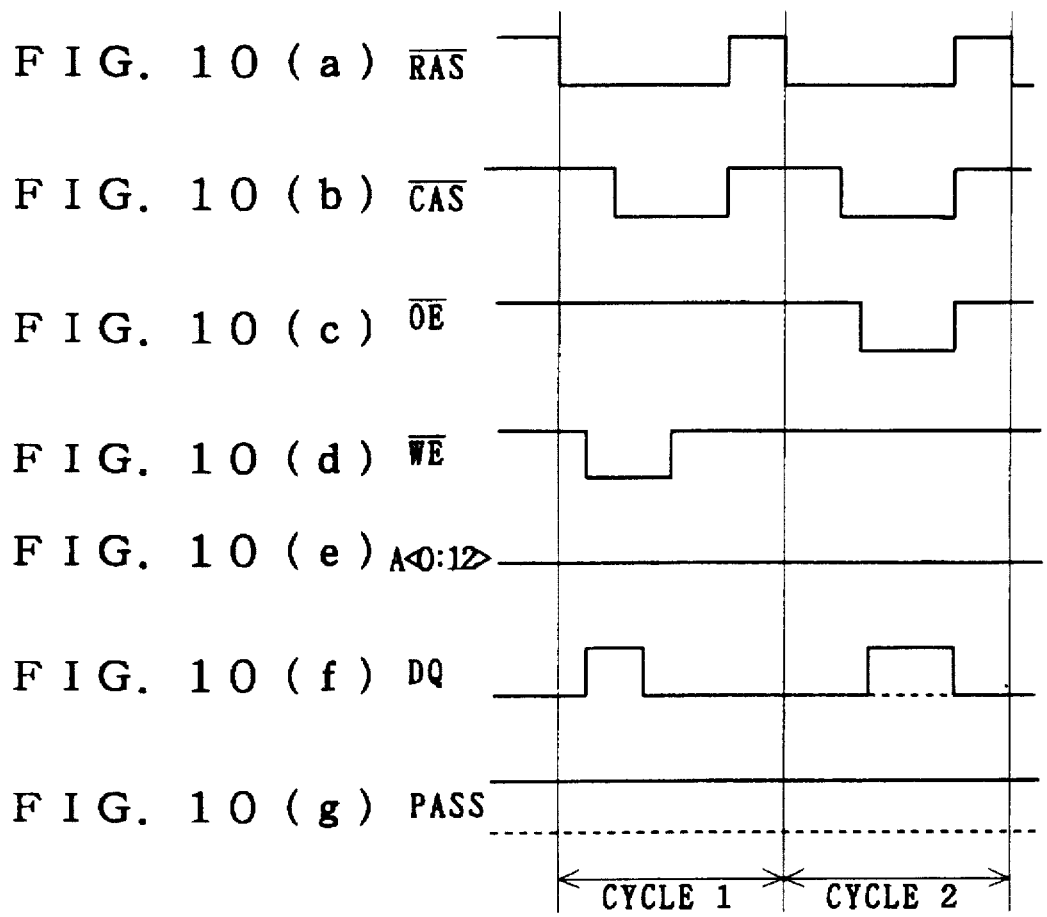
FIG. 10(a) RAS
FIG. 10(b) CAS
FIG. 10(c) OE
FIG. 10(d) WE
FIG. 10(e) A<0:12>
FIG. 10(f) DQ
FIG. 10(g) PASS FIG. 29(a) $\overline{RAS}$ FIG. 29(b) $\overline{CAS}$ FIG. 29(c) $\overline{WE}$ FIG. 29(d) $\overline{OE}$

FIG. 29(e) DQ

FIG. 29(f) Add.   CHECK

FIG. 29(g) READRESULT

FIG. 30
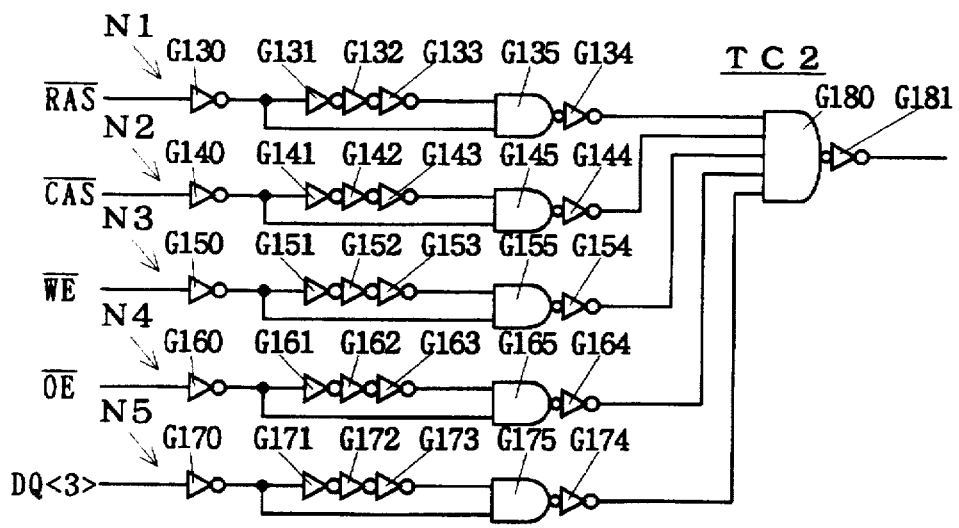
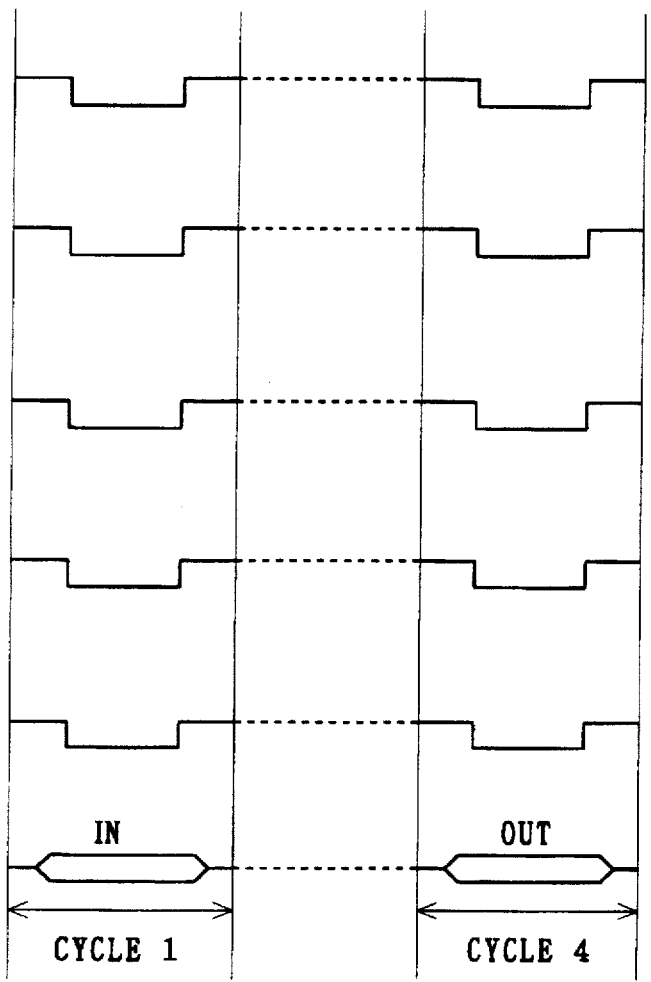
FIG. 31(a) RAS
FIG. 31(b) CAS
FIG. 31(c) WE
FIG. 31(d) OE
FIG. 31(e) DQ<3>
FIG. 31(f) Add.

1

SEMICONDUCTOR MEMORY DEVICE

This application is a continuation in part of application Ser. No. 8/551,484, filed Nov. 1, 1995 and now U.S. Pat. No. 5,642,317.

BACKGROUND OF THE INVENTION

1. Field of the Invention

The present invention relates to a semiconductor memory device, and more particularly to a dynamic RAM incorporating a test mechanism.

2. Description of the Background Art

Manufactured DRAM chips are shipped after testing all memory cells to verify normal writing and reading by means of a tester. As the memory capacity of DRAM chips tends to increase, the testing time increases. For example, in a 64M (megabit) DRAM chips, a simple test procedure of writing "1" in all memory cells, reading "1" from all memory cells, writing "0" in all memory cells, and reading "0" from all memory cells in a cycle time of 90 ns takes $90 \times 19^{-9} \times 4 \times 64 \times (1024)^2 = 24$ seconds.

Actually, testing in a test procedure adding various inspection items takes about 300 seconds. However, since DRAM chips must be mass produced at a rate of several millions per month, the processing capacity is raised and the testing time is shortened by measuring plural DRAM chips simultaneously.

FIG. 32 shows a configuration for simultaneous parallel measurement of plural DRAM chips. In FIG. 32, n test pieces, DRAM chips M1 to Mn, are connected parallel to a tester 70. The tester 70 possesses n signal drivers D11 to D1n, and n data judging circuits J11 to J1n. The signal driver D11 and data judging circuit J11 are connected to DQ pin of the DRAM chip M1, and write data is applied to the DQ pin of the DRAM chip M1 in a write cycle, and the data judging circuit J11 judges if the DRAM chip M1 outputs correct read data in a read cycle. Similarly, thereafter, the signal driver D12 and data judging circuit J12 are connected to DQ pin of the DRAM chip M2, and signal driver D1n and data judging circuit J1n to DQ pin of the DRAM chip Mn, sequentially.

The tester 70 is also designed to give specific signals to $\overline{RAS}$ (hereinafter /RAS) pin, $\overline{CAS}$ (CAS) pin, $\overline{OE}$ (/OE) pin, $\overline{WE}$ (/WE) pin and address signal pins of individual DRAM chips M which are not shown in the drawing.

Hitherto, as mentioned above, using a tester having as many as signal drivers and data judging circuits as the number of n DRAM chips to be tested, by testing n DRAM chips simultaneously, the processing capacity was raised and the testing time was shortened. However, the tester having a plurality of data judging circuits is expensive, and the testing cost tends to increase.

SUMMARY OF THE INVENTION

A first aspect of the invention relates to a semiconductor device for writing and reading plural data in plural memory cells which are specified by the same address signal through a plurality of pairs of input and output wires, comprising a plurality of terminals, a plurality of write means connected to the plurality of terminals respectively for writing write data in the plural of memory cells through the plurality of pairs of input and output wires, a plurality of read means for reading data from the plural memory cells through the plurality of pairs of input and output wires, a plurality of output means connected between the plurality of terminals and the plurality of read means respectively, for outputting a plurality of read data read out by the plurality of read means to the plurality of terminals, a mode setting means for outputting test mode signal, degenerating means for generating a first signal indicating that the read data connected to the degenerating means are all at the first state, for generating a second signal indicating that the read data connected to the degenerating means are all at the second state, for generating a third signal indicating that the read data connected to the degenerating means include read data at the first state and the second state, comparative means connected to the degenerating means and a terminal which is one of the plurality of terminals, for comparing the output of the degenerating means with the expected data from the terminal, test result outputting means generating a fourth signal by checking the third signal of the degenerating means and the result of comparison of the comparative means, responsive to the test mode signal of the mode setting means.

A second aspect of the invention relates to a semiconductor memory of device of claim 1 comprising, wherein the output means comprise buffer circuit which are set in high impedance state, at the time of input of the expected data from outside through the terminal that is connected to the buffer circuit responsive to the test mode signal of the mode setting means.

A third aspect of the invention relates to a semiconductor memory device of the first aspect, wherein the comparative result hold means comprises a first hold means for holding a fifth state at the beginning of the test mode and holding a sixth state after the fourth signal of the test result outputting means indicates the incorrectness of write and read action, and at least until the end of the test mode, and a second hold means for holding the state of the first hold means at a prescribed timing in non-volatile manner.

A fourth aspect of the invention relates to a semiconductor memory device of the third aspect, wherein the second hold means has a seventh state and an eighth state, having the seventh state at the time of production and changes to the eighth state receiving the fifth state of the first holding means at the prescribed timing.

A fifth aspect of the invention relates to a semiconductor memory device of the fourth aspect, wherein the second hold means includes a fuse element and a switch means interposed in series in a route between a signal input pin which is supplied which a first potential and a second potential, and the switch means has a control electrode connected to the output of the test result outputting means, the switch means becomes conductive when the first holding means hold the fifth state at the prescribed timing so that a voltage applied to the signal input pin flows a current melting the fuse element.

A sixth aspect of the invention relates to a semiconductor memory device, wherein the first potential is higher than power source potential, wherein the signal input pin is an address input pin, the semiconductor memory device further comprises an address buffer connected to the address input pin, for passing an address signal inputted from the address input pin during ordinary action, wherein the address buffer includes a first MOS transistor of a first conductivity type having one electrode connected to the address input pin and a gate electrode connected to the address input pin, a second MOS transistor of a second conductivity type having one electrode connected to the other electrode of the first MOS transistor and a gate electrode connected to the address input pin, a third MOS transistor of the second conductivity type having one electrode connected to the other electrode of the second MOS transistor and the other electrode applied with the second potential and a fourth MOS transistor of the first conductivity type having one electrode applied with the power source potential and the other electrode connected to the other electrode of the first MOS transistor, and a potential at the other electrode of the first MOS transistor is brought into the power source potential by making the third MOS transistor non-conducting and the fourth MOS transistor conducting when the fuse element is melted.

According to the semiconductor memory device of the first aspect of the invention, when the parallel test of action in writing and reading multi-bit data is conducted for a plurality of semiconductor memory devices, there is no need for connecting the individual semiconductor memory device to a testing device outside for conducting action test in writing and reading, and accordingly the cost for test can be reduced. Provision of the degenerate means which degenerates a plurality of data produces an effect of simplifying the constitution and reducing size of the test mechanism as compared with the case where multi-bit read data are compared individually.

BRIEF DESCRIPTION OF THE DRAWINGS

FIG. 9 is a structural diagram for individual judgement according to the first preferred embodiment of the semiconductor memory device of the invention;

FIG. 10(a)–FIG. 10(g) are timing charts for individual judgement according to the first preferred embodiment of the semiconductor memory device of the invention;

FIG. 12 is a circuit diagram illustrating the constitution of a test result holding circuit according to the second preferred embodiment of the invention;

FIG. 29(a)–FIG. 29(g) are timing charts for individual judgement according to the fifth preferred embodiment of the semiconductor memory device of the invention;

FIG. 30 is a circuit diagram illustrating a modified example of the fifth preferred embodiment of the semiconductor memory device of the invention;

FIG. 31(a)–FIG. 31(f) are timing charts illustrating an operation of the modified example of the fifth preferred embodiment of the semiconductor memory device of the invention.

DESCRIPTION OF THE PREFERRED EMBODIMENTS

<First Preferred Embodiment>

<A. Device Constitution>

Figure 1:
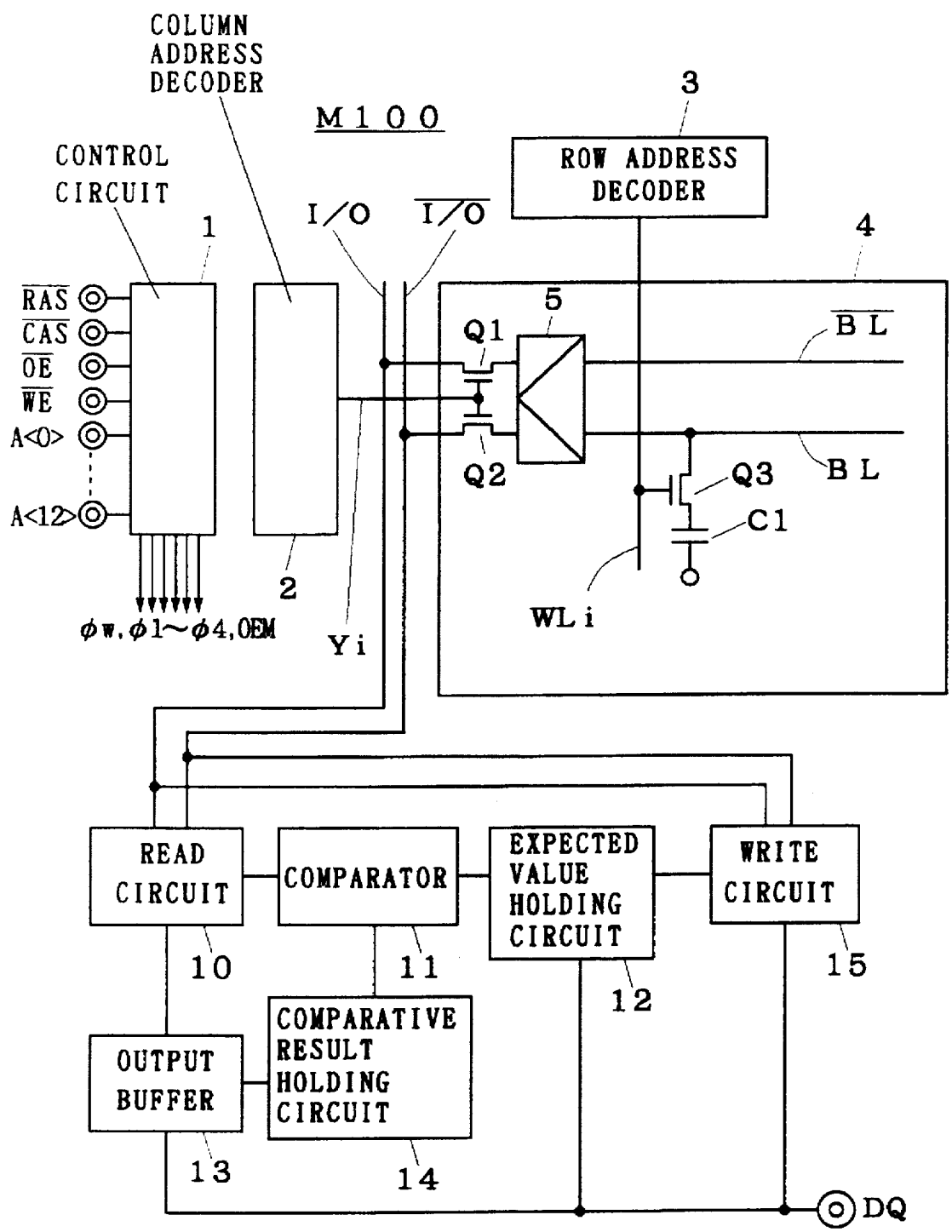
FIG. 1 is a block diagram illustrating the constitution of a first preferred embodiment of a semiconductor memory device of the invention.

FIG. 1 shows the constitution of a DRAM chip M100 incorporating a test mechanism as a first preferred embodiment of a semiconductor memory device of the invention. In FIG. 1, the DRAM chip 100 comprises, same as in the prior art, a control circuit 1 having /RAS pin, /CAS pin, /OE pin, a /WE pin, and address signal pins A<0> to A<12>, a memory cell array 4, and a column address decoder 2 and a row address decoder 3 connected to the memory cell array 4.

The memory cell array 4 comprises an N type MOSFET Q1 having a source electrode connected to a $\overline{I/O}$ (/I/O) wire, an N type MOSFET Q2 having a source electrode connected to an I/O wire, a sense amplifier 5 connected to drain electrodes of the N type MOSFETs Q1 and Q2, for comparing the potential difference of bit lines $\overline{BL}$ (/BL), BL, and an N type MOSFET Q3 having a source electrode connected to the bit line /BL, with a capacitor C1 connected to the drain electrode. Herein, the capacitor C1 and N type MOSFET Q3 form a memory cell. The gate electrodes of the N type MOSFETs Q1 and Q2 are commonly connected to the row address decoder 3. In FIG. 1, however, only a partial constitution of the memory cell array is shown.

To the I/O wire and /I/O wire, further, a read circuit 10 for reading out data and a write circuit 15 for writing in data are connected. The read circuit 10 is connected with an output buffer 13 for outputting the read data to DQ pin (data input/output pin), and a comparator 11 for comparing the read data and expected value, and the comparator 11 is combined with an expected value holding circuit 12 for holding the expected value, and a comparative result holding circuit 14 for holding the result of comparison in the comparator 11, and the output buffer 13 is connected with the comparative result holding circuit 14, and the expected value holding circuit 12 and write circuit 15 are connected to DQ pin.

Figure 2:
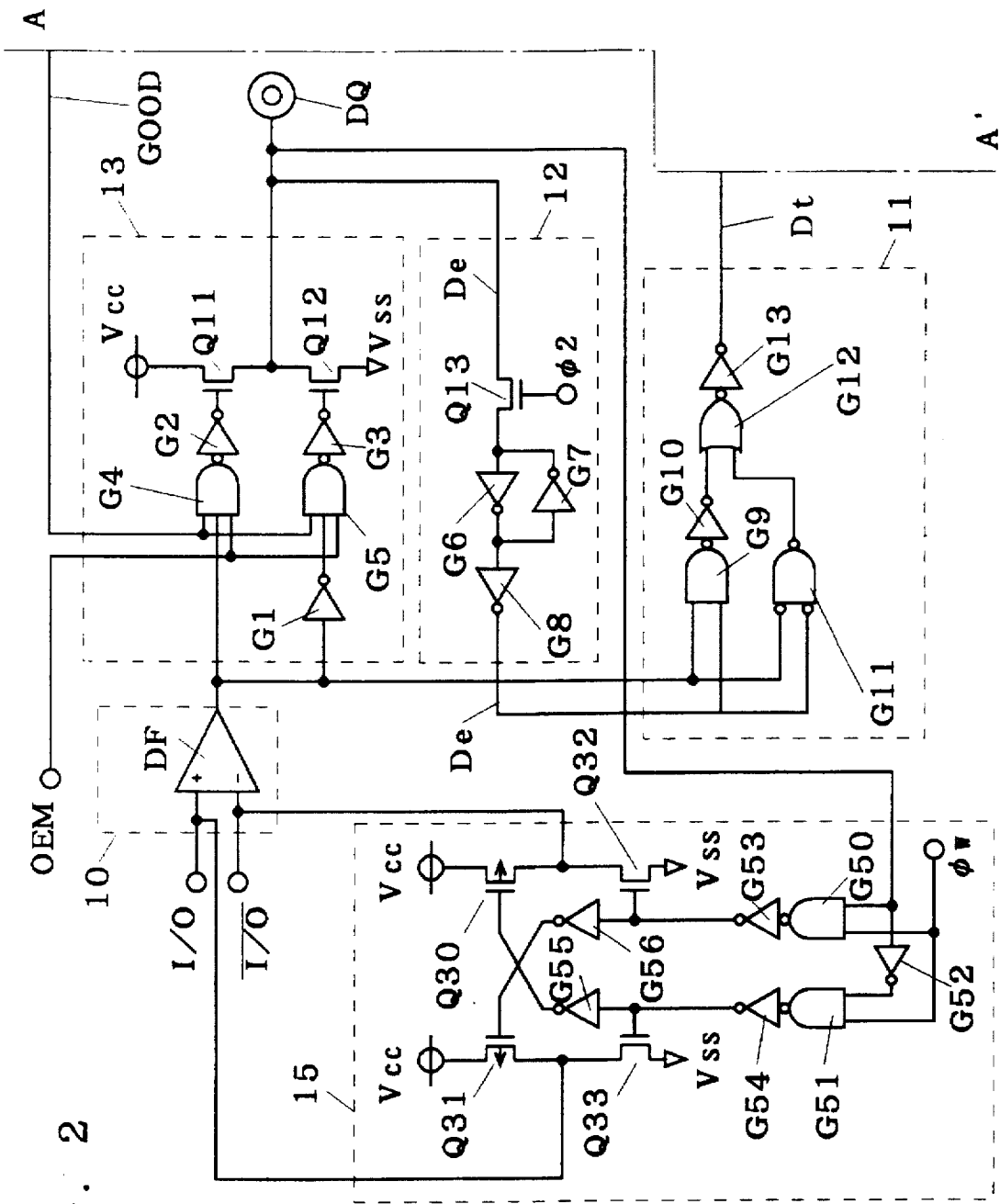
FIG. 2 is a circuit diagram illustrating the constitution of the first preferred embodiment of the semiconductor memory device of the invention.
Figure 3:
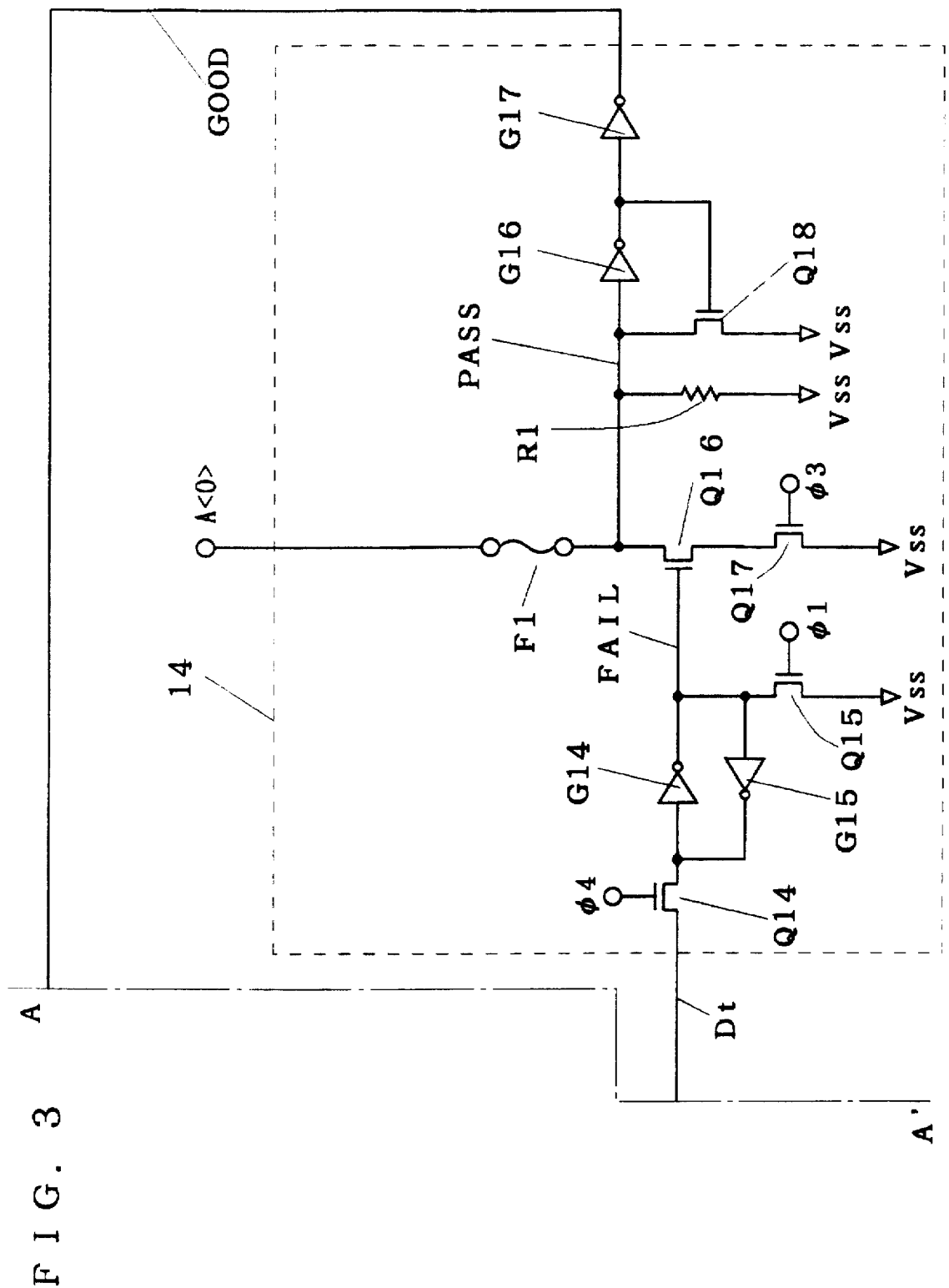
FIG. 3 is a circuit diagram illustrating the constitution of the first preferred embodiment of the semiconductor memory device of the invention.

Referring now to FIG. 2 and FIG. 3 shown as circuit diagrams of constitution of the DRAM chip M100, the constitution and operation of the control circuit 1, read circuit 10, comparator 11, expected value holding circuit 12, output buffer 13, comparative result holding circuit 14, and write circuit 15 are described below. FIG. 2 and FIG. 3 are coupled together along line AA'.

<A-1. Read Circuit>

First the constitution is described. As shown in FIG. 2, the read circuit 10 is composed of a differential amplifier DF, and an I/O wire is connected to a+input, and a /I/O wire to a−input. The output of the differential amplifier DF is given to an inverter G1 and a three-input NAND gate G4 of inverter G4 of the output buffer 13, and a NAND gate G9 of comparator 11.

<A-2. Output Buffer>

The output buffer 13 possesses N type MOSFETs Q11 and Q12 connected in series between power source potential $V_{CC}$ and grounding potential $V_{SS}$, inverters G2, G3, and three-input NAND gates G4, G5. Common connection nodes of the N type MOSFETs Q11 and Q12 are connected to DQ pin. The output of the inverter G2 is connected to the gate electrode of the N type MOSFET Q11, and the output of the three-input NAND gate G4 is connected to the input of the inverter G2. To the input of the three-input NAND gate G4, output circuit control signal OEM (hereinafter called OEM signal), GOOD output from the comparative result holding circuit 14, and output from the differential amplifier DF are given.

The output of the inverter G3 is connected to the gate electrode of the N type MOSFET Q12, and the output of the three-input NAND gate G5 is connected to the input of the inverter G3. To the input of the three-input NAND gate G5, OEM signal, GOOD output from the comparative result holding circuit 14, and output of the inverter G1 are given.

<A-3. Expected Value Holding Circuit>

The expected value holding circuit 12 possesses an N type MOSFET (Q13, and inverters G6 to G8, and the expected value De given from the DQ pin are given to the drain electrode of the N type MOSFET Q13, the source electrode of the N type MOSFET Q13 is connected to the input of the inverter G6, the output of the inverter G6 is connected to the input of the inverter G8, and the output of the inverter G8 becomes expected value De. Herein, to the gate electrode of the N type MOSFET Q13, a $\phi 2$ signal is given. An inverter G7 is connected in a loop form to the inverter 6.

<A-4. Comparator>

The comparator 11 possesses a NAND gate G9, inverters G10, G13, and NOR gates G11, G12. To the input of the NAND gate G9, the output of the differential amplifier DF, and expected value De outputted from the expected value holding circuit 12 are given, and an inverter G10 is connected to the output of the NAND gate G9. To the input of the NOR gate G11, the output of the differential amplifier DF and expected value De outputted from the expected value holding circuit 12 are given, and the outputs of the NOR gate G11 and inverter G10 are given to the input of the NOR gate G12, and an inverter G13 is connected to the output of the NOR gate G12, and the output of the inverter G13 becomes output Dt of the comparator 11.

<A-5. Comparative Result Holding Circuit>

The comparative result holding circuit 14 comprises N type MOSFETs Q14 to Q18, inverters G14 to G17, a resistance element R1, and a fuse element F1. The output Dt of the comparator 11 is given to the drain electrode of the N type MOSFET Q14, and the source electrode of the N type MOSFET Q14 is connected to the input of the inverter G14. The inverter G14 is connected with an inverter G15 in a loop form, and the output of the inverter G14 is connected to the drain electrode of the N type MOSFET Q15 and gate electrode of the N type MOSFET Q16. Herein, the source electrode of the N type MOSFET Q15 is connected to the grounding potential $V_{SS}$, and a $\phi 1$ signal is given to the gate electrode.

The drain electrode of the N type MOSFET Q16 is connected to the power source potential $V_{CC}$ through the fuse element F1 (route cut-off element), and the source electrode is connected to the drain electrode of the N type MOSFET Q17. The source electrode of the N type MOSFET Q17 is connected to the grounding potential $V_{SS}$, and a $\phi 3$ signal is given to the gate electrode.

The drain electrode of the N type MOSFET Q16 is connected to the input of the inverter G16, and is also connected to the resistance element R1 connected to the grounding potential $V_{SS}$, and the drain electrode of the N type MOSFET Q18 of which source electrode is connected to the grounding potential $V_{SS}$.

The output of the inverter G16 is connected to the input of the inverter G17 and gate electrode of the N type MOSFET Q18, and the output of the inverter G17 becomes a GOOD signal which is the output of the comparative result holding circuit 14.

<A-6. Write Circuit>

The write circuit 15 possesses P type MOSFETs Q30 and Q31, N type MOSFETs Q32 and Q33, NAND gates G51 and G52, and inverters G52 to G56. The P type MOSFET Q30 and N type MOSFET Q32 are connected in series between the power source potential $V_{CC}$ and grounding potential $V_{SS}$, and connection nodes of the two are connected to a /I/O wire. Similarly, the P type MOSFET Q31 and N type MOSFET Q33 are also connected in series between the power source potential $V_{CC}$ and grounding potential $V_{SS}$, and connection nodes of the two are connected to an I/O wire.

A DQ pin is connected directly to the input of the NAND gate G50, and is also connected to the input of the NAND gate G51 through the inverter G52, and a write circuit activating signal φw given from the control circuit 1 is given directly to the inputs of NAND gates G50 and G51. Inverters G53 and G54 are respectively connected to the outputs of the NAND gates G50 and G51, and the output of the inverter G53 is connected to the gate electrode of the N type MOSFET Q32 and inverter G55. The output of the inverter G54 is connected to the gate electrode of the N type MOSFET Q33 and inverter G56. The output of the inverter G55 is connected to the gate electrode of the P type MOSFET Q31, and the output of the inverter G56 is connected to the gate electrode of the P type MOSFET Q30.

<A-7. Test Control Circuit>

Figure 4:
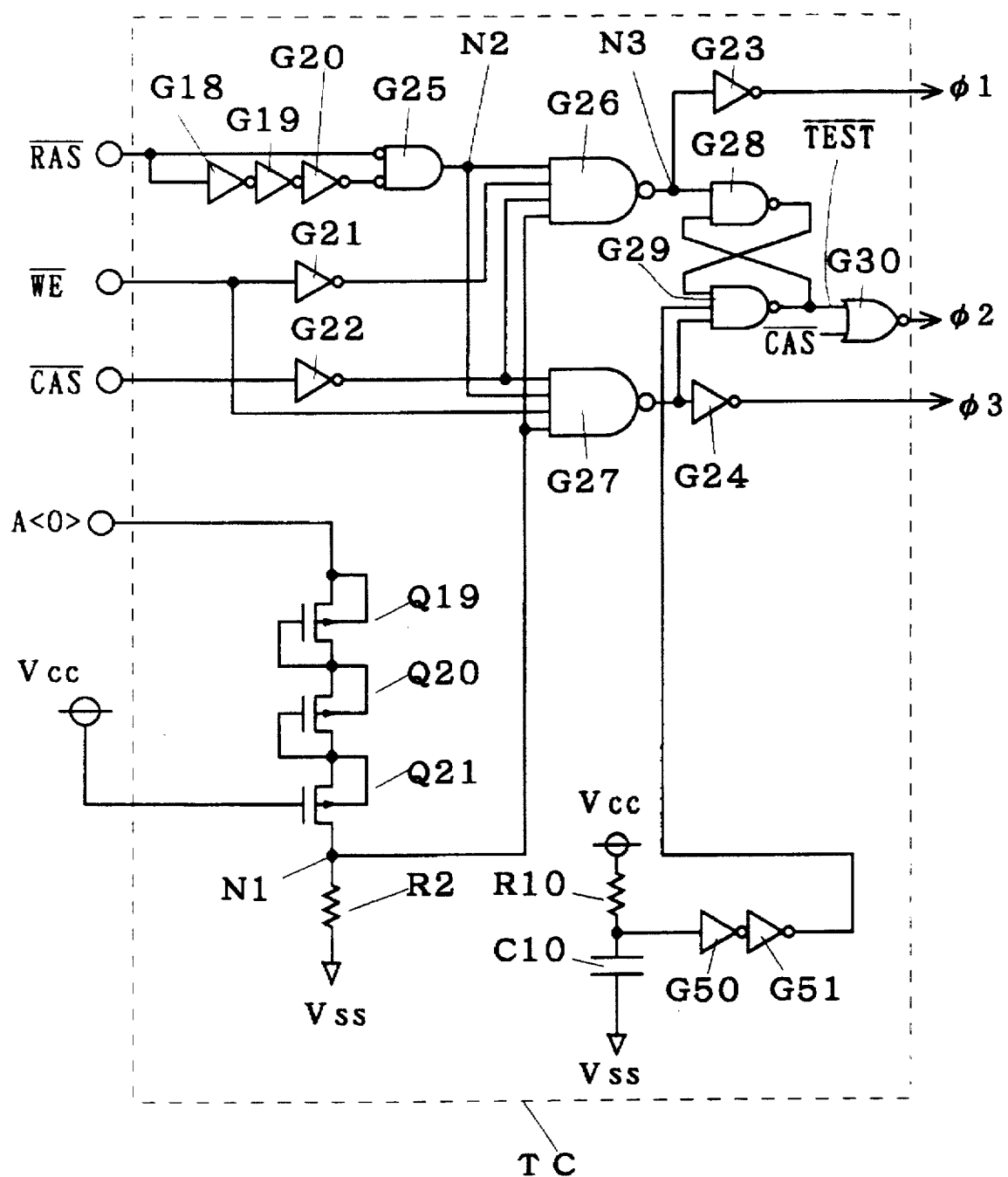
FIG. 4 is a circuit diagram illustrating the constitution of a test control circuit in the first preferred embodiment of the semiconductor memory device of the invention.

Referring next to FIG. 4, the constitution of the test control circuit TC included in the control circuit 1 is described below. The test control circuit TC is a circuit for outputting control signals φ1 to φ3 and $\overline{\text{TEST}}$ (/TEST) signal for controlling the test mechanism of the DRAM chip M100.

As shown in FIG. 4, the test control circuit TC possesses inverters G18 to G24 and G50, G51, NOR gates G25, G30, NAND gates G26 to G29, P type MOSFETs Q19 to Q21, and resistance elements R2 and R20.

A/RAS signal terminal is connected directly to the input of the NOR gate G25, and is connected to the inverter G18 out of the inverters G18 to G20 connected in series, and the output of the inverter G20 is connected to the input of the NOR gate G25. A /WE signal terminal is connected to the inverter G21, and a /CAS signal terminal is connected to the inverter G22.

An address pin A<0> is connected to the source electrode of the P type MOSFET Q19, and P type MOSFETs Q20 and Q21 are connected in series to the drain electrode of the P type MOSFET Q19, and the drain electrode of the P type MOSFET Q21 is connected to the grounding potential $V_{SS}$ through the resistance element R2. The gate electrodes of the P type MOSFETs Q19 and Q20 are connected to respective drain electrodes, and the gate electrode of the P type MOSFET Q21 is connected to the power source potential $V_{CC}$, and the back gates of the P type MOSFETs Q19, Q20, Q21 are connected to respective source electrodes. Herein, the connection point of the drain electrode of the P type MOSFET Q21 and resistance element R is called node N1.

The NAND gates G26 and G27 are of four-input type, and to the NAND gate G26, the outputs of the NOR gate G25 and inverters G21, G22, and source electrode of the P type MOSFET Q21 are connected, and to the input of the NAND gate G27, the NOR gate G25, output of the inverter G22, and /WE signal terminal are connected. Herein, the connection point of the output of the NOR gate G25 and input of the NAND gate G27 is called node N2.

The output of the NAND gate G26 is connected to the input of the inverter G23 and NAND gate G28, and the output of the NAND gate G27 is connected to the input of the inverter G24 and input of the NAND gate G29. Herein, the connection point of the inverter G23 is called node N3.

The output of the NAND gate G28 is connected to the input of the NAND gate G29, and the output of the NAND gate G29 is connected to the input of the NAND gate G28, and is also connected to one input of the NOR gate G30.

Herein, the NAND gate G29 is of three-input type, and to the remaining one input, the output of the power on reset circuit (POR circuit) for outputting "L" for a specific period after turning on the power is connected. Therefore, in the "L" period of the output of the POR circuit, a flip-flop circuit composed of NAND gates G28 and G29 is reset to "H". The output of the NAND gate G29 is a /TEST signal. In the constitution of the POR circuit, a resistance element R10 and a capacitor C10 are sequentially connected in series between the power source potential $V_{CC}$ and grounding potential V, the connection point of the resistance element R10 and capacitor C10 is inputted into the inverter G50, the output of the inverter G50 is inputted into the inverter G51, and the output of the inverter G51 is the output of the POR circuit.

To the other input of the NOR g ate G30, a /CAS signal terminal is connected, and a φ2 signal is outputted from the NOR gate G30. From the inverter G23, a φ1 signal is outputted, and from the inverter G24, a φ3 signal is outputted.

<A-8. OEM Signal Generating Circuit>

Figure 5:
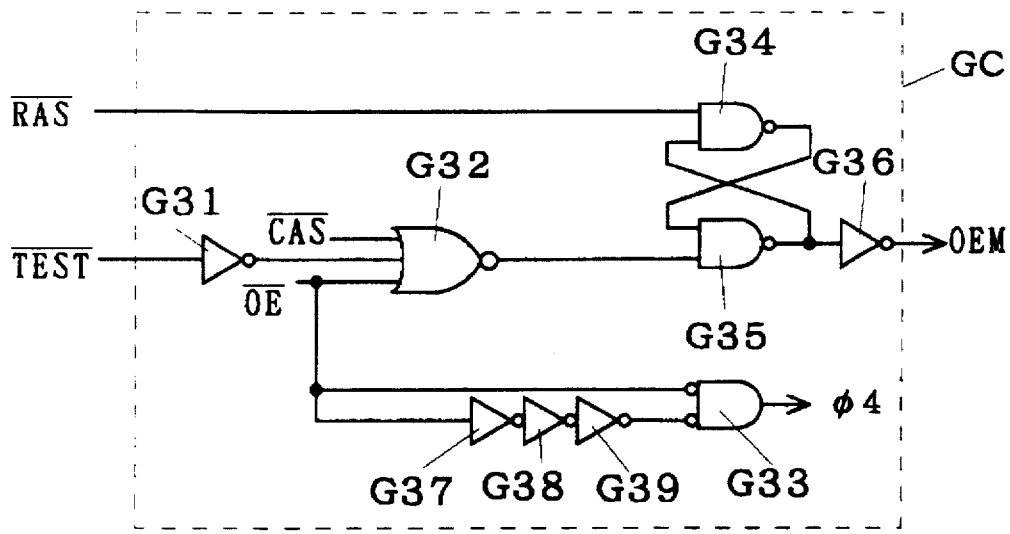
FIG. 5 is a circuit diagram illustrating the constitution of an OEM signal generating circuit in the first preferred embodiment of the semiconductor memory device of the invention.

Referring to FIG. 5, the constitution of an OEM signal generating circuit GC contained in the control circuit 1 is described below. As shown in FIG. 5, the OEM signal generating circuit GC possesses inverters G31, G36 to G39, NOR gates G32 and G33, and NAND gates G34 and G35.

In FIG. 5, a /TEST signal is inputted in the inverter G31, and to the NOR gate G32 of three inputs, /CAS signal terminal and /OE signal terminal are connected, and also the output of the inverter G31 is connected.

The /RAS signal terminal is connected to the input of the NAND gate G34, and the output of the NOR gate G32 is connected to the input of the NAND gate 35G. The output of the NAND gate G34 is connected to the input of the NAND gate G35, and the output of the NAND gate G35 is connected to the input of the NAND gate G34 and is also connected to the inverter G36.

The /OE signal terminal is connected directly to the NOR gate G33, and is connected to the inverter G37 out of the inverters G37 go G39 connected in series, and the output of the inverter G39 is connected to the NOR gate G33.

Herein, from the inverter G36, an OEM signal is outputted, and a φ4 signal is outputted from the NOR gate G33.

<B. Parallel Test Action>

Parallel test of the DRAM chip M100 incorporating the test mechanism is explained below by reference to FIG. 2 to FIG. 5, FIG. 6 showing the constitution for the test, and FIG. 7(a)–FIG. 7(l) and FIG. 8(a)–FIG. 8(g) showing the timing chart of test action of DRAM chip M100. In FIG. 7(a)–FIG. 7(l) and FIG. 8(a)–FIG. 8(g), the broken line indicates the action in the event of wrong operation, and the solid line shows the normal action. FIG. 7(a)–FIG. 7(l) and FIG. 8(a)–FIG. 8(g) are coupled together at line BB'.

Figure 6:
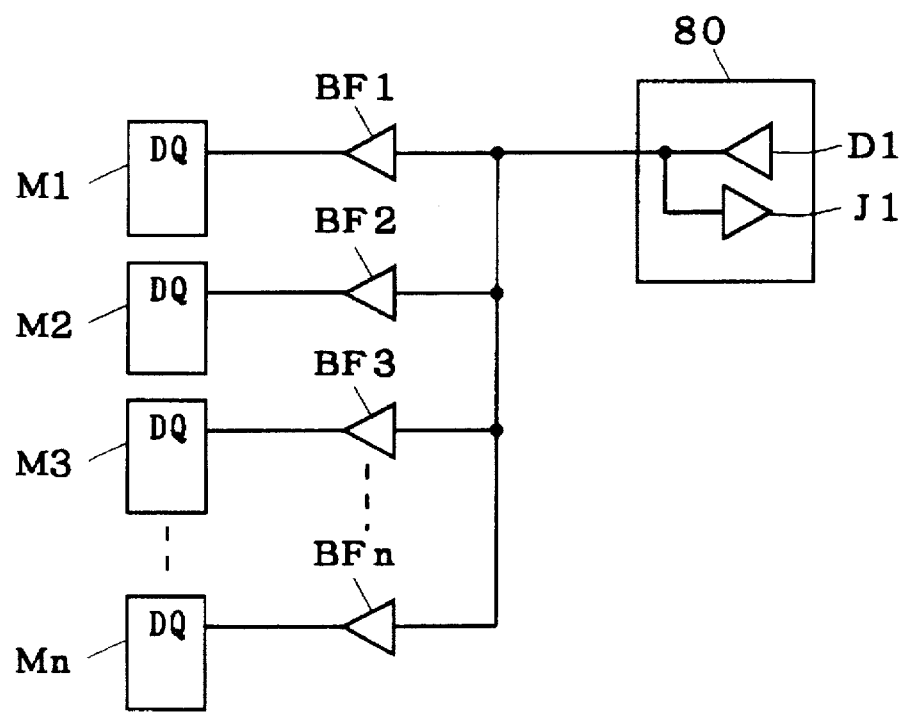
FIG. 6 is a structural diagram for parallel test by using the semiconductor memory device of the invention.
Figure 7:
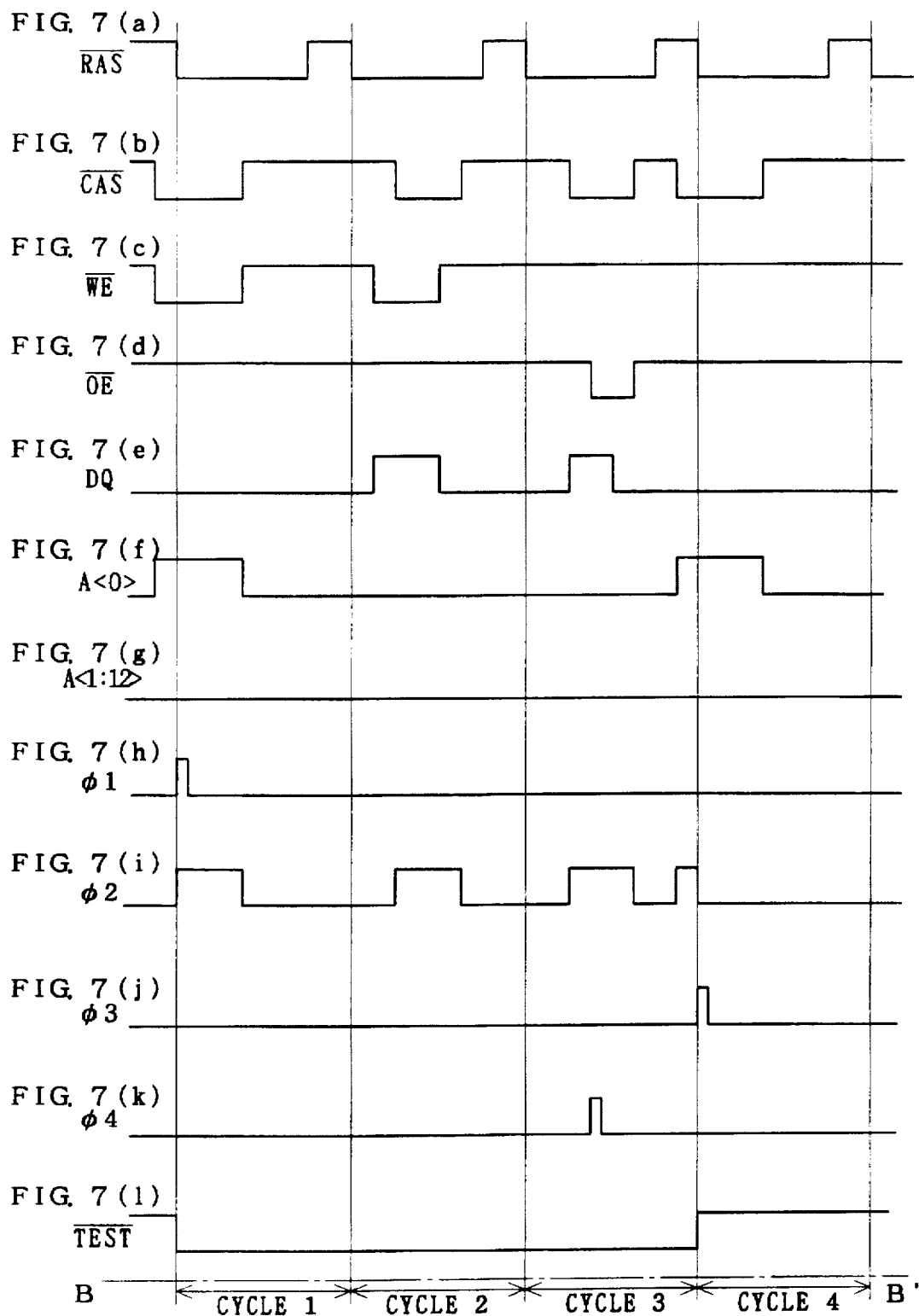
FIG. 7(a)–FIG. 7(l) are timing charts for parallel test according to the first preferred embodiment of the semiconductor memory device of the invention.
Figure 8:
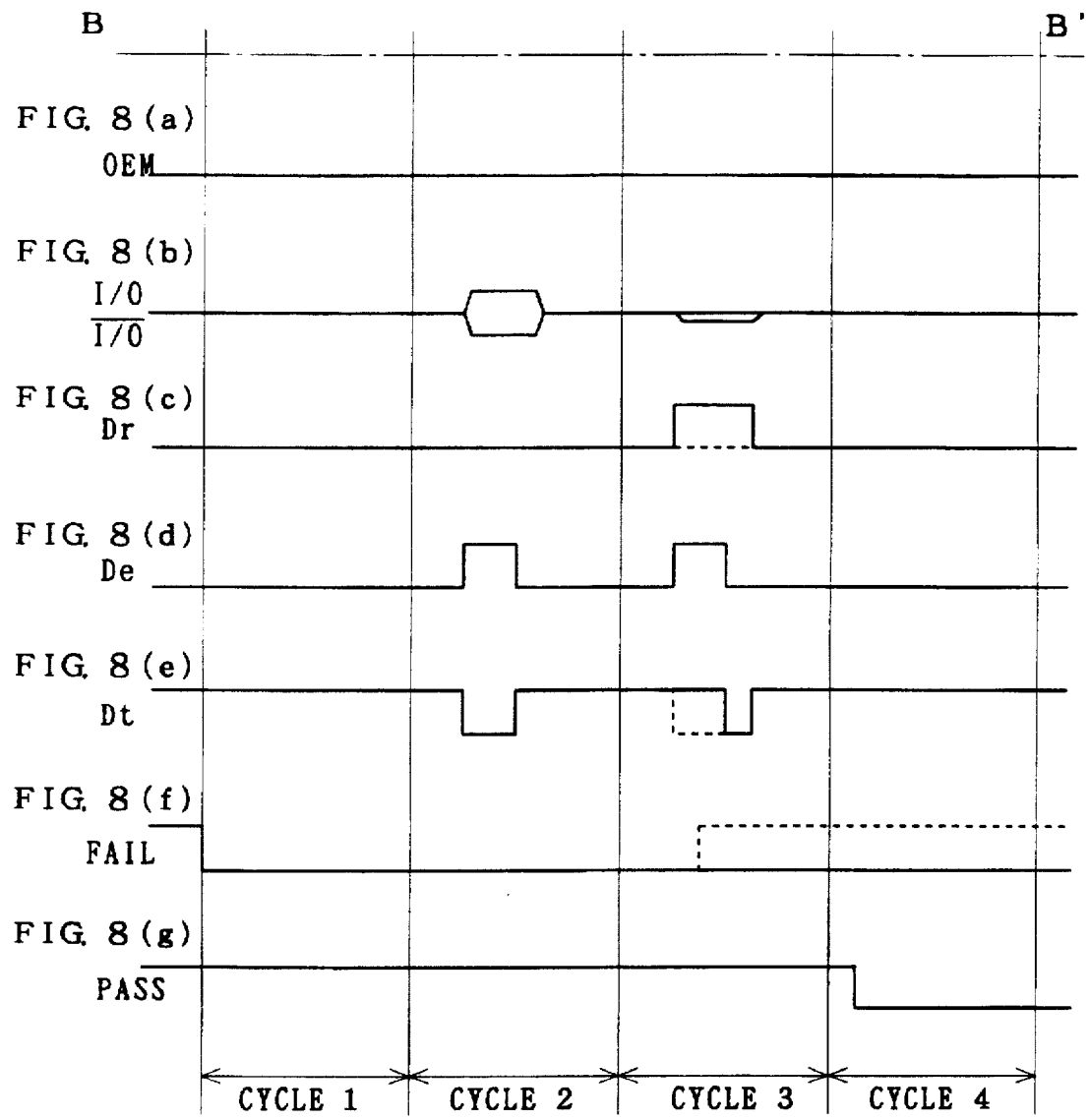
FIG. 8(a)–FIG. 8(g) are timing charts for parallel test according to the first preferred embodiment of the semiconductor memory device of the invention.

In FIG. 6, n test pieces, DRAM chips M1 to Mn, are connected to a tester 80 through buffer circuits BF1 to BFn, respectively. Herein, the DRAM chips M1 to Mn individually possess the test mechanism, and one of them is the DRAM chip M100. The buffer circuit BF1 to BFn is preliminarily provided in the test board for mounting DRAM chips M1 to Mn.

The tester 80 used in testing of DRAM incorporating test mechanism possesses only one signal driver D1 and one data judging circuit J1, and the input and output route of the tester 80 is branched, and is connected to n DRAM chips M1 to Mn. Herein, only one input and output route of the tester 80 is shown, but actually, there are routes for giving specific signal also in /RAS pin, /CAS pin, /OE pin, /WE pin, and address signal pin of the DRAM chip M100.

<B-1. Cycle 1>

First, in cycle a of /RAS signal shown in FIG. 7(a)–FIG. 7(l) and FIG. 8(a)–FIG. 8(g), the operation mode of the DRAM chip M100 is changed from ordinary mode to test mode. To change from ordinary mode to test mode, prior to change from "H" to "L" of /RAS signal, /CAS signal and /WE signal are changed from "H" to "L", and the value of the address pin A<0> is set at $V_{CC}+3|V_{THP}|$ or more (where $V_{THP}$ is the threshold value of the P type MOSFET), and the /TEST signal becomes "L" at the timing of change of /RAS signal from "H" to "L", thereby changing to the test mode. To change from the test mode to the ordinary mode, meanwhile, the power source is turned off.

The changeover action to the test mode is sequentially described below. After the /RAS signal is changed to "L", the input of the NOR gate G25 becomes "H" for the portion of delay time by the inverters G18, G19, G20. Therefore until the delay time by the inverters G18, G19, G20 is over, the output of the NOR gate G25, that is, the node N2 is at "H". Herein, since both /CAS signal and /WE signal are "L", the outputs of the inverters G21 and G22 are both "H".

Incidentally, the potential of the address pin A<0> is $V_{CC}+3|V_{THP}|$ or more, and hence the P type MOSFETs Q19, Q20, Q21 connected in series conduct, and the potential of the node N1 becomes "H". Therefore, the output of the NAND gate G26, that is, the potential of the node N3 becomes "L" for a specific period, and the signal $\phi 1$ becomes "H". On the other hand, the output of the NAND gate G27 is "H".

Herein, the NAND gates G28 and G29 constitute a reset/set flip-flop, and it is set when the potential of the node N3 becomes "L" for a specific period, and the output of the NAND gate 29, that is, the /TEST signal becomes "L". When the /TEST signal becomes "L", in the "L" period of the /CAS signal, the signal $\phi 2$ is "H".

<B-2. Cycle 2>

In cycle 2 of the /RAS signal, when the /RAS signal is changed to "L", and when the /CAS signal is changed to "L", the potential of the address pins A<0> to A<12> is "L". At the same time, the /WE signal becomes "L", and the write cycle is specified. Therefore, in this cycle, the "H" data applied to the DQ pin is written in the memory cell selected by the row address (A<0> to A<12>), and column address (A<0> to A<12>).

<B-3. Cycle 3>

In cycle 3 of the /RAS signal, when the /RAS signal is changed to "L", and when the /CAS signal is changed to "L", the potential of the address pins A<0> to A<12> is "L". At the same time, the /WE signal becomes "H", and the read cycle is specified. Therefore, the data is read out from the memory cell in which "H" is written in the preceding cycle.

The data of the memory cell read out into the I/O wire pair (I/O wire and /I/O wire) is amplified in the differential amplifier DF in the read circuit 10, and the read data Dr becomes "H". In cycle 3, since the /WE signal is "H", it is the read cycle, but the /TEST signal is "L", and therefore "H" is given to one input of the NOR gate G32 of the OEM signal generating circuit GC shown in FIG. 5, and whatever the other input may be, the output of the NOR gate G32 is "L", and the output of the NAND gate G35 is "H", and hence the OEM signal is "L".

When the OEM signal is "L", the outputs of the NAND gates G4 and G5 of the output buffer 13 shown in FIG. 2 are "H" whatever the other input may be to the gate electrodes of the N type MOSFETs Q11 and Q1, the outputs of the NAND gates G4 and G5 are given through the inverters G2 and G3, and hence the N type MOSFETs Q11 and Q12 are both in non-conductive state, while the output buffer 13 is set in high impedance state.

Therefore, in cycle 3, the expected value De of the data being readout from the tester 80 can be given to the DRAM chip M100 through the DQ pin.

The expected value holding circuit 12 has a latch circuit composed of inverters G6 and G7, and the expected value De of the read data given to the DQ pin is transferred to the latch circuit in the "H" period of the signal $\phi 2$. The expected value De of the read out outputted from the latch circuit is given to the comparator 11, and is compared with the read data Dr outputted from the read circuit 10.

Herein, for the expected value De of "H", when the read data Dr is "H", it is normal action, and the comparative result Dt outputted from the comparator 11 is "H". In the event of wrong action due to some cause, however, when the read data Dr is "L", the comparative result Dt is "L".

The comparative result Dt is given to the comparative result holding circuit 14 shown in FIG. 3, and an N type MOSFET Q14 is provided at the inlet part of the comparative result holding circuit 14. To the gate electrode of the N type MOSFET Q14, a signal $\phi 4$ becoming "H" for the portion of the delay time by the inverters G37, G38, G39 connected in series shown in FIG. 4 is applied when the /OE signal becomes "L".

The comparative result Dt is transferred to a latch circuit composed of inverters G14 and G15 of the comparative result holding circuit 14 in the "H" period of the signal $\phi 4$. The output (FAIL signal) of the latch circuit is reset to "L" through the N type MOSFET Q15 by the signal $\phi 1$ which is "H" for a specific period when getting in the test mode, and is set to "H" when the comparative result Dt is "L", that is, due to onset of wrong action.

<B-4. Cycle 4>

In cycle 4, the end of test mode is specified. When the /RAS signal is changed to "L", by setting the /CAS signal to "L" and the potential of the address signal pin A<0> to $V_{CC}+3|V_{THP}|$ or more, in the test control circuit TC shown in FIG. 4, node N1 becomes "H", and the output of the NAND gate G27 becomes "L" for the portion of the delay time by the inverters G18, G19, G29 from the moment the /RAS signal is changed to "L". Therefore, the /TEST signal which is the output of the reset/set flip-flop composed of the NAND gates G28 and G29 becomes "H", and the signal $\phi 3$ becomes "H" for the portion of the delay time by the inverters G18, G19, G20.

In the event of a wrong action during test mode period (corresponding to the period of cycles 2, 3 in FIG. 7(a)–FIG. 7(l) and FIG. 8(a)–FIG. 8(g)), since the FAIL signal is "H" as mentioned above, when the signal $\phi 3$ becomes H, the N type MOSFETs Q16 and Q17 of the comparative result holding circuit 14 shown in FIG. 3 will conduct. Herein, by using a large transistor size in the N type MOSFETs Q16 and Q17, a large current flows from the power source potential $V_{CC}$ to the grounding potential $V_{ss}$, and the fuse F1 is melted. As a result, in the route from the drain electrode of the N type MOSFET Q16 to the inverter G16, that is, in the route for outputting the comparative result Dt as GOOD signal as test result signal (hereinafter called PASS line), the potential is discharged through the resistance element R1, and hence becomes "L". Therefore, the GOOD signal as the test result signal of the comparative result holding circuit 14 is "L". Herein, when the potential of the PASS line becomes "L", the N type MOSFET Q18 conducts, and a route connected to the grounding potential is formed through the N type MOSFET Q18, and this is a constitution for enhancing the noise resistance of the GOOD signal.

If wrong action does not occur in the test mode period, the FAIL signal is "L", and hence the N type MOSFET Q16 does not conduct, and if the signal φ3 becomes "H", current does not flow through the N type MOSFET Q16 and N type MOSFET Q17. At this time, the current flowing from the power source potential $V_{CC}$ through the fuse F1 is limited by the resistance element R1, and hence the fuse F1 is not melted. Therefore, the PASS line remains charged to "H" through the fuse element F1 from the power source potential $V_{CC}$. Therefore, the GOOD signal which is the output of the comparative result holding circuit 14 is "H".

Herein, the time spent for such series of parallel test action is about 3 seconds, for example, when testing 100 DRAM chips M.

<C. Individual Judging Action>

In this way, after parallel test of n DRAM chips M by using the tester 80, the power source is once turned off to change over to the ordinary mode, and the individual DRAM chips M are checked for wrong action by the tester 80 (hereinafter called individual judging).

FIG. 9 shows the constitution for checking the DRAM chip M100 for wrong action by using the tester 80. In FIG. 9, the route linking the input and output end of the tester 80 and the DQ pin of the DRAM chip M100 is connected to the grounding potential through the resistance element R3.

The timing chart for checking the action of the DRAM chip M100 is shown in FIG. 10(a)–FIG. 10(g). Cycle 1 of /RAS signal shown in FIG. 10(a)–FIG. 10(g) is the write cycle, and cycle 2 is the read cycle. In FIG. 10(a)–FIG. 10(g), the broken line indicates the operation with a wrong action, and the solid lines shows a normal operation.

The action of the write circuit 15 shown in FIG. 2 is described below. In FIG. 2, a write circuit activating signal φw given from the control circuit 1 is a signal which becomes "H" when the /CAS signal and /WE signal are "L", and when reading, the write circuit activating signal φw becomes "L". When the write circuit activating signal φw is "L", that is, when reading, the P type MOSFET Q30 and N type MOSFET Q32 are both in non-conductive state, and the connection node of the two is in high impedance state. The P type MOSFET Q31 and N type MOSFET Q33 are also both in non-conductive state, and the connection node of the two is in high impedance state.

When writing, on the other hand, the write circuit activating signal φw is "H", and when the write data given from the DQ pin is "H", the potential of the I/O wire is "H" and the potential of the /I/O wire is "L". To the contrary, when the write data is "L", the potential of the I/O wire is set to "L", and the potential of the I/O wire, "H".

<C-1. Cycle 1>

Therefore, in cycle 1 of the /RAS signal shown in FIG. 10(a)–FIG. 10(g), in the "L" period of the /CAS signal and /WE signal, the write data given from the DQ pin is written, and the write data given from the DQ pin at this time is "H".

<C-2. Cycle 2>

Next, in cycle 2, the written data is read out. In the DRAM chip M100 causing wrong action during test mode period, the fuse F1 of the comparative result holding circuit 14 shown in FIG. 3 is melted, and hence the route connected to the power source potential $V_{CC}$ is cut off, and the potential of the PASS line is at the grounding potential through the resistance element R1. Therefore, the output of the inverter G17, that is, the GOOD signal is "L", and the outputs of the HAND gates G4 and G5 of the output buffer 13 are "H", and the output buffer 13 remains in high impedance state also in cycle 2. Therefore, the potential of the DQ pin becomes the grounding potential through the resistance element R3.

On the other hand, in the DRAM chip M100 not causing wrong action during the test mode period, since the fuse F1 of the comparative result holding circuit 14 is not melted, the route connected to the power source potential $V_{CC}$ is held, and the PASS line remains at "H", and the GOOD signal becomes "H", and the data "H" written in cycle 1 is read out from the output buffer 13.

In this way, depending on whether the fuse F1 is melted or not, the comparative result is held in non-volatile manner, and by confirming whether the potential of the DQ pin is "H" or the grounding potential by the data judging circuit J1, presence or absence of wrong action can be detected.

When individual judging of one DRAM chip M is over, the judged DRAM chip M and the tester 80 are disconnected, and the next DRAM chip M is connected, and is judged individually in the same manner. Therefore, with n DRAM chips, individual judging action is done n times.

The time spent for individual judging action is about 0.5 seconds, and, for example, 100 DRAM chips M can be judged individually in about 50 seconds.

<D. Action and Effect>

As described herein, since the semiconductor memory device of the invention incorporates the test mechanism, the parallel test can be done by the inexpensive tester having only one data judging circuit, and then the comparative result is judged individually by using the same tester, so that the qualification of the semiconductor memory device can be judged without lowering the through-put.

In the above explanation, it was an example of parallel test in the test mode period in two cycles of cycle 2 and cycle 3 of /RAS signal, but the test mode period is not limited to two cycles, and the test mode period may be set in an arbitrary number of cycles.

<Second Preferred Embodiment>

<E. Device Constitution>

In the first preferred embodiment of the semiconductor memory device of the invention described so far, the comparative result holding circuit 14 has a fuse F1 which melts down reflecting the result of comparison, but a floating gate transistor may be used instead of the fuse F1. The DRAM chip M100A using floating gate transistor in the comparative result holding circuit is described below.

Figure 11:
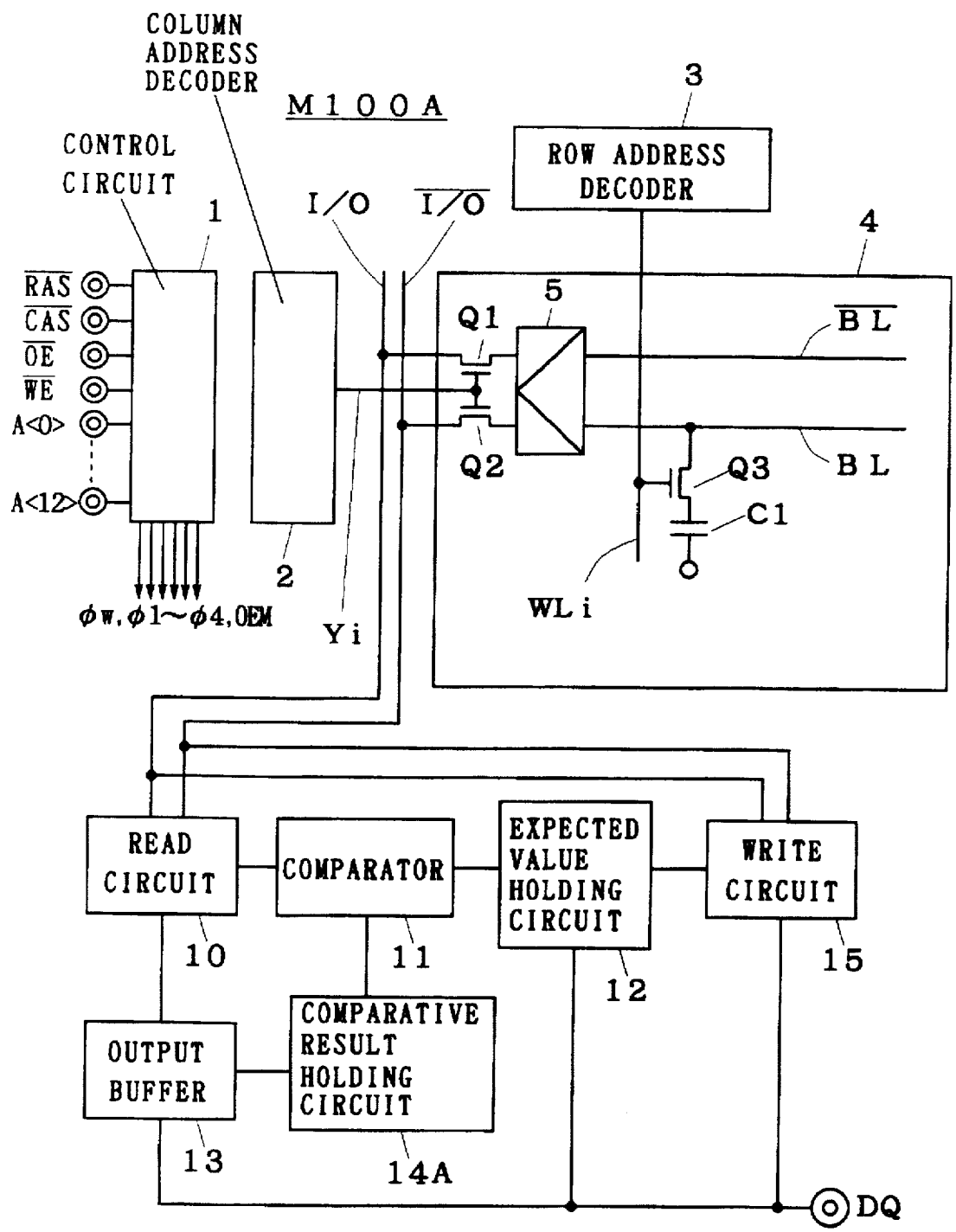
FIG. 11 is a block diagram illustrating the constitution of a second preferred embodiment of a semiconductor memory device of the invention.
Figure 14A:
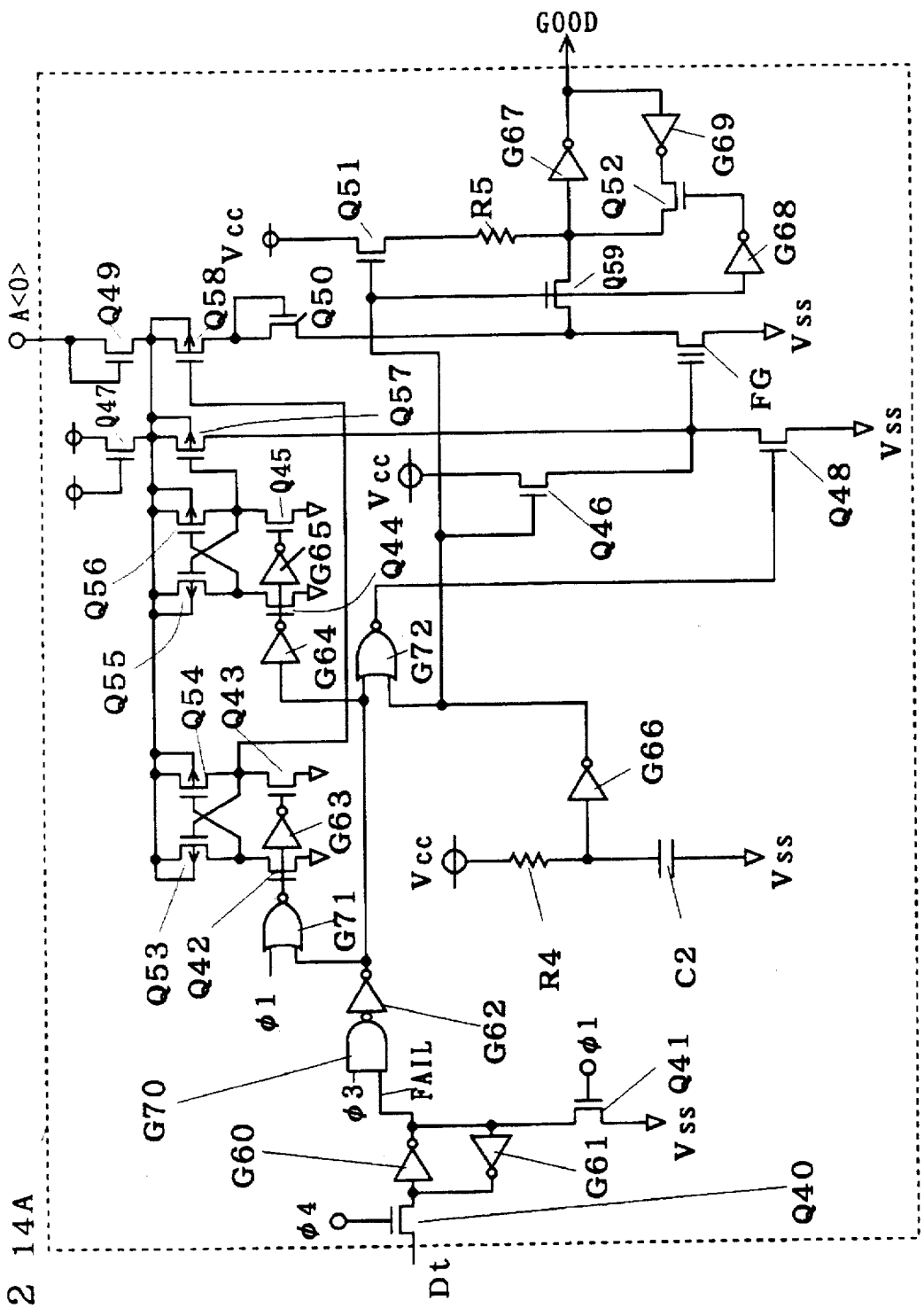
FIG. 14 is a block diagram illustrating the constitution of the third preferred embodiment of the semiconductor memory device of the invention.

FIG. 11 shows the constitution of the DRAM chip M100A. Herein, the same parts as in the constitution of the DRAM chip M100 explained in FIG. 1 are identified with same reference numerals, and repeated explanations are omitted. In FIG. 11, only the comparative result holding circuit 14A is different, and the following explanation relates to the comparative result holding circuit 14A alone.

<E-1. Comparative Result Holding Circuit>

First, the constitution is described by referring to FIG. 12 showing the circuit diagram of the comparative result holding circuit 14A. In FIG. 12, the comparative result holding circuit 14A comprises inverters G60 to G69, NAND gate G70, NOR gates G71 and G72, N type MOSFETs Q40 to Q52, P type MOSFETs Q53 to Q59, N type floating gate transistor FG, resistance elements R4 and R5, and capacitor C2.

The output Dt of the comparator circuit 11 is given to the drain electrode of the N type MOSFET Q40, and the source electrode of the N type MOSFET Q40 is connected to the input of the inverter G60. To the inverter G60, an inverter G61 is connected in a loop form, and the output of the inverter G60 is connected to the drain electrode of the N type MOSFET Q41 and the input of the NAND gate G70. To the gate electrode of the N type MOSFET Q40, a signal $\phi 4$ is given from the control circuit 1, and a signal $\phi 1$ is given to the gate electrode of the n type MOSFET Q41, and the source electrode is connected to the grounding potential $V_{SS}$. To one input of the NAND gate G70, signal $\phi 3$ is given from the control circuit 1.

An inverter G62 is connected to the output of the NAND gate g70, and the output of the inverter G62 is connected to the inputs of the NOR gates G71 and G72,and is also connected to the inverter G64.

The P type MOSFET Q53 and N type MOSFET Q42, and the P type MOSFET Q54 and N type MOSFET Q43 are connected in series both, and the N type MOSFETs Q42 and Q43 are connected to the grounding potential. The output of the NOR gate G71 is connected to the gate electrode of the N type MOSFET Q42, and is also connected to the inverter G63, and the output of the inverter G63 is also connected to the gate electrode of the N type MOSFET Q43. The connection node of the P type MOSFET Q53 and N type MOSFET Q42 is connected to the gate electrode of the P type MOSFET Q43, and the connection node of the P type MOSFET Q43 and N type MOSFET Q43 is connected to the gate electrode of the P type MOSFET Q53, and is also connected to the gate electrode of the P type MOSFET Q58.

The P type MOSFET Q55 and N type MOSFET Q44, and the P type MOSFET Q56 and N type MOSFET Q45 are connected in series both, and the N type MOSFETs Q44 and Q45 are connected to the grounding potential. The output of the inverter G64 is connected to the gate electrode of the N type MOSFET Q44, and is also connected to the inverter G65, and the output of the inverter G65 is also connected to the gate electrode of the N type MOSFET Q45. The connection node of the P type MOSFET Q55 and N type MOSFET Q44 is connected to the gate electrode of the P type MOSFET Q56, and the connection node of the P type MOSFET Q56 and N type MOSFET Q45 is connected to the gate electrode of the P type MOSFET Q5, and is also connected to the gate electrode of the P type MOSFET Q57.

Between the power source potential $V_{CC}$ and grounding potential $V_{SS}$, the resistance element R4 and capacitor C2 are connected in series, and the inverter G66 is connected to the connection node of the two, and the output of the inverter G66 is connected to the NOR gate G72.

The N type MOSFET Q47, P type MOSFET Q57, and N type MOSFET Q48 are connected in series between the power source potential $V_{SS}$ and the grounding potential $V_{SS}$, and the output of the NOR gate G72 is connected to the gate electrode of the N type MOSFET Q48. Herein, the gate electrode of the N type MOSFET Q47 is connected to the power source potential $V_{CC}$.

Herein, to the drain electrode of the N type MOSFET Q48, the source electrode of the N type MOSFET Q46 having the drain electrode connected to the power source potential $V_{CC}$ is connected, and the gate electrode of the N type MOSFET Q46 is connected to the output of the inverter G66.

The N type MOSFET Q49, P type MOSFET Q58, N type MOSFET Q50, and N type floating gate transistor FG (route cut-off element) are connected in series between the address signal pin A<0> and grounding potential $V_{SS}$, and the drain electrode of the N type MOSFET Q48 is also connected to the gate electrode of the N type floating gate transistor FG. Herein, the gate electrode of the N type MOSFET Q49 is connected to the address signal pin A<0>, and the gate electrode of the N type MOSFET Q49 is connected to the drain electrode. To the connection node of the N type MOSFET Q49 and P type MOSFET Q58, the source electrodes of the P type MOSFETs Q53 to Q57 are commonly connected. The back gates of the P type MOSFETs Q53 to Q58 are connected to the respective source electrodes.

The drain electrode of the N type floating gate transistor FG is connected to the source electrode of the N type MOSFET Q59, and the drain electrode of the N type MOSFET Q59 is connected to the inverter G67, and the output of the inverter G67 is a GOOD signal. The output of the inverter G67 is connected to the inverter G69, and the output of the inverter G69 is connected to the source electrode of the N type MOSFET Q52, while the drain electrode of the N type MOSFET Q52 is connected to the input of the inverter G67.

The source electrode of the N type MOSFET Q51 having the drain electrode connected to the power source potential $V_{CC}$ is connected to one end of the resistance element R5, and the other end of the resistance element R5 is connected to the input of the inverter G67. The gate electrode of the N type MOSFET Q51 is connected to the output of the inverter G66, and is also connected to the gate electrode of the N type MOSFET Q59 and input of the inverter G68, and the output of the inverter G68 is connected to the gate electrode of the N type MOSFET Q52.

<F. Parallel Test Action>

Referring to the timing charts shown in FIG. 12 and FIG. 7(a)–FIG. 7(l) and FIG. 8(a)–FIG. 8(g), the action of the comparative result holding circuit 14A is described. In a specific time after turning on the power source, the capacitor C2 is charged, and the input potential of the inverter G66 becomes "H", and the output side potential of the inverter G66 becomes "L".

<F-1. Cycle 1>

In cycle 1 of /RAS signal shown in FIG. 7(a)–FIG. 7(l) and FIG. 8(a)–FIG. 8(g), the potential of the address signal pin A<0> is set over $V_{CC}+3|V_{THP}|$, but the signal $\phi 1$ is "H" for a specific period, the output of the NOR gate G71 is "L", and the N type MOSFET Q43 conducts, and the potential at the connection node with the P type MOSFET Q54 is "L", and the P type MOSFET Q58 conducts, so does the N type MOSFET Q 50, and thereby the potential at the source side of the N type MOSFET Q50 becomes "H".

Besides, the signal $\phi 3$ is "L", and the output of the NAND gate G70 is "H", and the output of the inverter G62 is "L".

15

In this case, the output of the inverter G64 is "H", and the P type MOSFET Q56 conducts along with the conduction of the N type MOSFET Q44, and the potential at the connection node with the N type MOSFET Q45 becomes "H". The output of the NOR gate G72 is "H", and the P type MOSFET Q57 does not-conduct and the N type MOSFET Q48 conducts, so that the drain electrode side potential of the N type MOSFET Q48 becomes "L".

Therefore, electrons of the floating gate of the N type floating gate transistor FG run through to the drain electrode side, and the threshold value of the N type floating gate transistor FG becomes a low value and is initialized.

<F-2. Cycle 3>

Same as in the comparative result holding circuit 14 explained by reference to FIG. 3, when the signal $\phi 1$ becomes "H" for a specific period in cycle 1, the latch circuit composed of the inverters G60 and G61 is reset, and the output (FAIL signal) of the latch circuit becomes "L". In cycle 3, at the timing of the signal $\phi 4$ becoming "H", it is transferred to the latch circuit composed of inverters G60 and G61 of the comparative result holding circuit 14A. The FAIL signal is set to "H" when the comparative result Dt becomes "L", that is, by the onset of wrong action.

<F-3. Cycle 4>

In cycle 4, the potential of the address signal pin A<0> is set over $V_{CC}+3$ |$V_{THP}$|, and the /CAS signal is set to "L" ahead of the /RAS signal, so that the comparative result is held in the comparative result holding circuit 14A.

That is, in the case of FAIL signal being "H", when the signal $\phi 3$ becomes "H", the output of the NAND gate G70 becomes "L", and the output of the inverter G62 becomes "H". In this case, the output of the NOR gate G70 becomes "L", and the output of the inverter G63 becomes "H", and the N type MOSFET Q43 conducts, and the potential of the connection node with the P type MOSFET Q54 becomes "L".

Besides, the output of the inverter G62 is "H", and hence the output of the inverter G64 becomes "L" and the output of the inverter G45 becomes "H", and the N type MOSFET Q45 conducts, so that the potential of the connection node with the P type MOSFET Q56 becomes "L". Moreover, since the output of the NOR gate G72 is "L", the P type MOSFETs Q57 and Q58 conduct, and the N type MOSFET Q48 does not conduct, and the drain electrode side potential of the N type MOSFET Q48 is lowered from the potential of the address signal pin A<0> due to ON resistance of the N type MOSFET Q50 , and hence the power source potential $V_{CC}$ becomes higher, and the drain electrode side potential of the N type floating gate transistor is nearly at the potential of the address signal pin A<0>.

Therefore, electrons are injected into the floating gate of the N type floating gate transistor FG, and the threshold value of the N type floating gate transistor FG is heightened.

When the FAIL signal is "L", that is, in the absence of wrong action, if the signal $\phi 3$ becomes H, the potential of the connection node of N type MOSFET Q43 and P type MOSFET Q54 is "H", the potential of the connection node of P type MOSFET Q56 and N type MOSFET Q45 is "H", and the output of the NOR gate G72 is "H", and hence the P type MOSFETs Q57 and Q58 do not conduct, while the N type MOSFET Q48 conducts, and therefore the drain electrode side potential of the N type floating gate transistor FG is "L" and the threshold value of the N type floating gate transistor FG remains low. That is, depending on whether the N type floating gate transistor FG is capable of ON action or not, the comparative result is held in non-volatile manner.

<G. Individual Judging Action>

Once the power source is cut off, and when the power source is turned on again in order to judge individually by using the tester 80, the capacitor C2 is not charged until a specific time has passed, and the input side potential of the inverter G66 remains at "L". Therefore, the output side potential of the inverter G66 is "H" until the input side potential of the inverter G66 becomes higher than the threshold value of the inverter G66.

When the output side potential of the inverter G66 is "H", the output of the NOR gate G72 is "L", and the N type MOSFET Q48 does not conduct. Consequently, the N type MOSFETs Q46 and Q51 conduct. Herein, when the threshold value of the N type floating gate transistor FG is low (in the absence of wrong action), the N type floating gate transistor FG is turned on, and the route to be connected to the grounding potential $V_{SS}$ is held, and hence the drain electrode side potential of the N type floating gate transistor FG becomes "L", so that the GOOD signal becomes "H".

On the other hand, when the threshold value of the N type floating gate transistor FG is high (in the presence of wrong action), the N type floating gate transistor FG is not turned on, and the route connected to the grounding potential $V_{SS}$ is cut off. As a result, the drain electrode side potential of the N type floating gate transistor FG becomes "H", and the GOOD signal becomes "L", and hence the outputs of the NAND gates G4 and G5 of the output buffer 13 explained in FIG. 2 become "H", and the N type MOSFETs Q11 and Q12 do not conduct, and the output buffer 13 remains in high impedance state. Therefore, the potential of the DQ pin becomes a grounding potential through the resistance element R3 shown in FIG. 9, so that the occurrence of wrong action in the DRAM chip M100A is known.

In a specific time after the power source is turned on, the capacitor C2 is charged, and the input side potential of the inverter G66 becomes "H", and the output side potential of the inverter G66 becomes L. When the output side potential of the inverter G66 becomes "L", the N type MOSFETs Q46, Q51, Q59 do not conduct, while the N type MOSFET Q52 conducts, and a latch circuit is composed of the inverters G67 and G69, and the immediately preceding GOOD signal is held.

<H. Action and Effect>

As explained herein, by using the floating gate transistor instead of the fuse which is melted by overcurrent, the comparative result holding circuit can be composed. Thus, use of floating gate transistor as route cut-off element is advantageous in simplifying the manufacturing process because the floating gate transistor can be formed in the process of forming the memory cell array, as compared with the case of using a fuse element as route cut-off element.

<I. Modified Example>

In the N type floating gate transistor FG of the comparative result holding circuit 14A explained by reference to FIG. 12, the floating gate transistor for so-called EEPROM capable of electrically easing the memory content is used, but the floating gate transistor for so-called EPROM for erasing the memory content by irradiation with ultraviolet ray may be also used. In this case, instead of the initialization action in cycle 1 of the /RAS signal shown in FIG. 7(a)–FIG. 7(l) and FIG. 8(a)–FIG. 8(g), the irradiation action of ultraviolet ray is required.

<Third Preferred Embodiment>

In the first and second preferred embodiments of the semiconductor memory device of the invention described so far, in the individual test using the tester 80, presence or absence of wrong action is judged when the DQ pin of the DRAM chip M100 causing wrong action is set in high impedance state also in the read cycle, but it may be directly judged by the GOOD output of the comparative result holding circuit 14 or 14A.

<J. Device Constitution>

That is, a wrong action indication circuit for indicating occurrence of wrong action by performing an abnormal action in ordinary mode by receiving a GOOD output of the comparative result holding circuit 14 or 14A is further provided in the DRAM chip M100 or 100A.

<J-1. Wrong Action Indicating Circuit>

Figure 13:
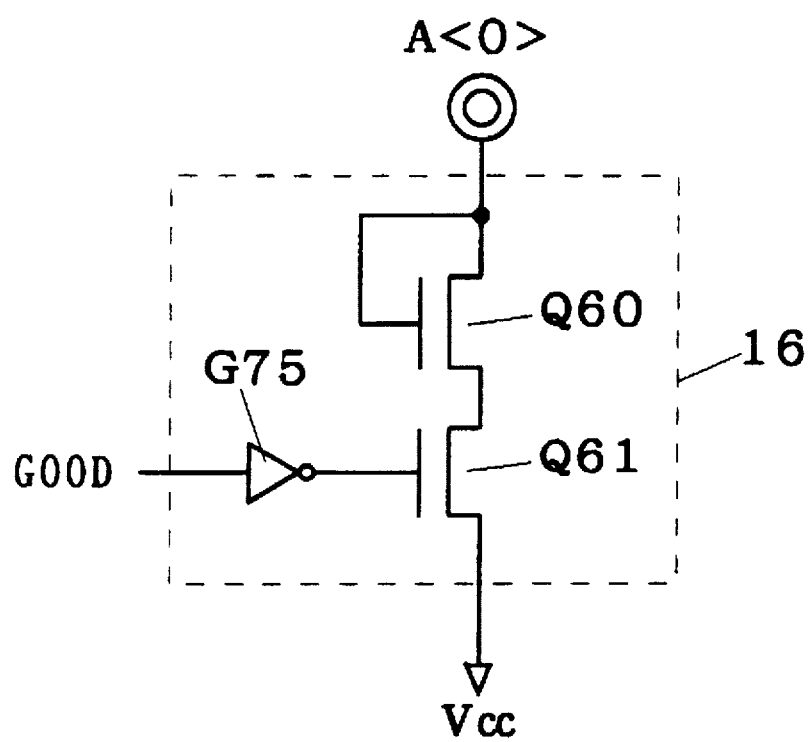
FIG. 13 is a circuit diagram illustrating the constitution of a wrong action indicating circuit in a third preferred embodiment of a semiconductor memory device of the invention.

An example of wrong action indicating circuit is shown in FIG. 13. In FIG. 13, the wrong action indicating circuit 16 possesses N type MOSFETs Q60 and Q61 connected in series between the address signal pin A<0> and grounding potential $V_{SS}$, and the gate electrode of the N type MOSFET Q60 is connected to the address signal pin A<0>, and the GOOD output of the comparative result holding circuit 14 is fed into the inverter G75, and the output of the inverter G75 is connected to the gate electrode of the N type MOSFET Q60.

In thus constituted wrong action indicating circuit 16, when the GOOD output of the comparative result holding circuit 14 is "L", that is, in the presence of wrong action, the N type MOSFET Q61 conducts, and a current flows between the address signal pin A<0> and grounding potential $V_{SS}$. On the other hand, when the GOOD output is "H", that is, in the absence of wrong action, current does not flow between the address signal pin A<0> and grounding potential $V_{SS}$, and therefore by checking for presence or absence of current, presence or absence of wrong action can be judged.

Figure 14:
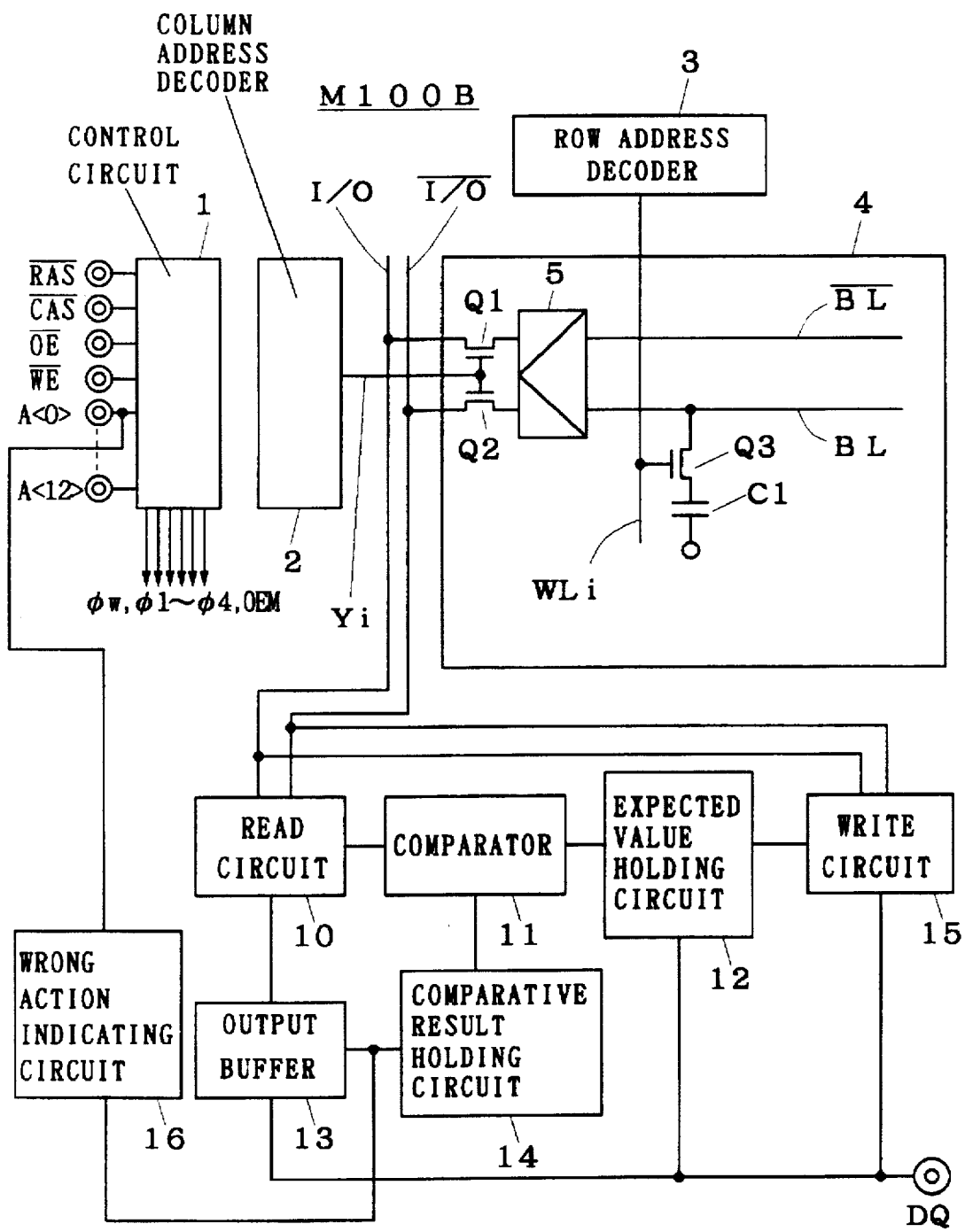

FIG. 14 shows the constitution of the DRAM chip M100B having the wrong action indicating circuit 16. In FIG. 14, the wrong action indicating circuit 16 is inserted between the address signal pin A<0> and grounding potential $V_{SS}$, and the GOOD output of the comparative result holding circuit 14 is connected to the wrong action indicating circuit 16, but the others are same as in the constitution of the DRAM chip M100 and duplicate explanations are omitted. Incidentally, the connecting means of the wrong action indicating circuit 16 is not limited to the address signal pin A<0> alone, but any signal terminal may be used such as /RAS signal terminal and /CAS signal terminal.

<K. Individual Judging Action>

Figure 15:
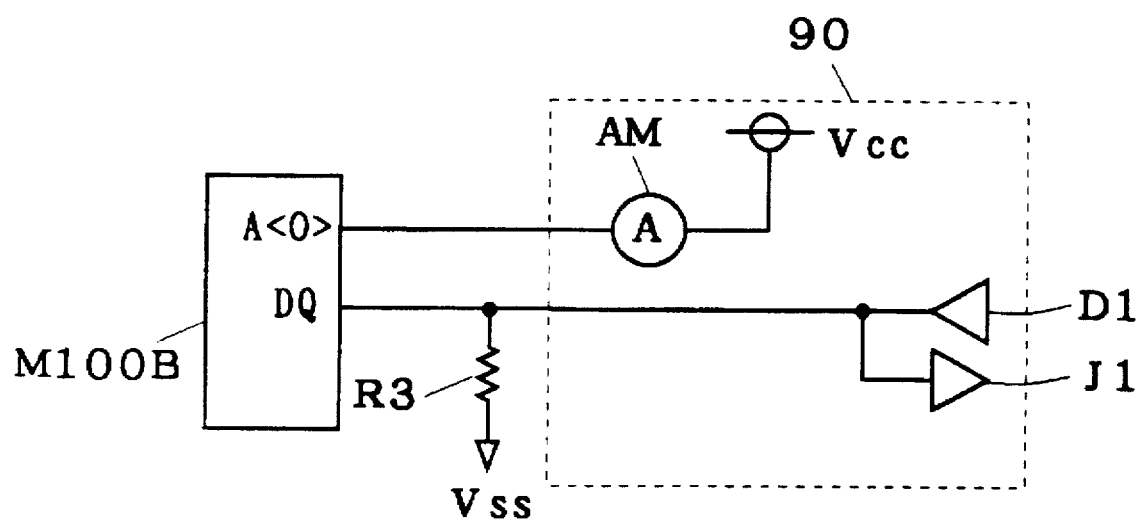
FIG. 15 is a structural diagram for individual judgement according to the third preferred embodiment of the semiconductor memory device of the invention.

To check the action of the DRAM chip M100B in such constitution, the tester used in individual judging should be provided with an ammeter. FIG. 15 shows a constitution of checking the action of the DRAM chip M100B by using the tester provided with an ammeter In FIG. 15, a tester 90 has an ammeter AM provided in a route connected to the address signal pin A<0>, out of the input and route routes connected to a signal driver D1, and one end of the ammeter AM is connected to the power source potential $V_{CC}$. The others are same as in the tester.

When judged individually by using the tester 90 of such constitution, when the DRAM chip M100B has a wrong action, the ammeter AM detects the current flowing between the address signal pin A<0> and the grounding potential $V_{SS}$, so that presence or absence of wrong action can be judged.

In the DRAM chip M100B, since the GOOD output of the comparative result holding circuit 14 is connected also to the output buffer 13, presence or absence of wrong action can be judged also by the DQ pin which falls in high impedance state also in the read cycle.

If, meanwhile, the presence or absence of wrong action is not judged by the output of the DQ pin, the GOOD output of the comparative result holding circuit 14 may not be connected to the output buffer 13, and the three-input NAND gates G4 and G5 of the output buffer 13 can be changed to the two-input NAND gate.

<Fourth Preferred Embodiment>

<L. Device Constitution>

In the first to third preferred embodiments of the semiconductor memory device of the invention described so far, the test mechanism is incorporated in the DRAM chip M having the output buffer and write circuit connected commonly to the DQ pin, but the test mechanism may be similarly incorporated in the DRAM chip M in which the output buffer is connected to the data output terminal, or Dout pin, and the write circuit is connected to the data input terminal, or Din pin. Explained below is the DRAM chip M100C incorporating the test mechanism in the DRAM chip M having Dout pin and Din pin.

Figure 16:
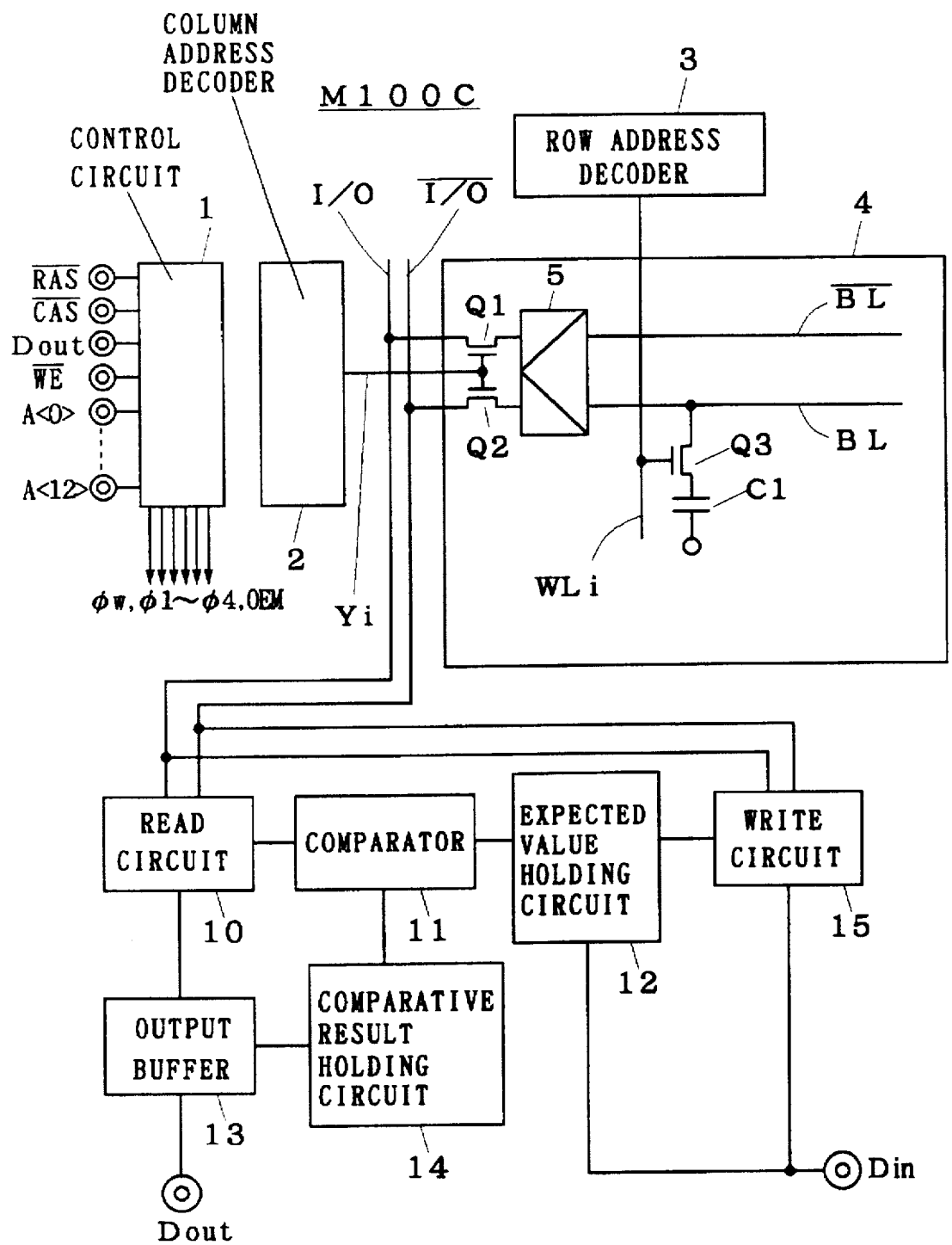
FIG. 16 is a block diagram illustrating the constitution of a fourth preferred embodiment of a semiconductor memory device of the invention.
Figure 17:
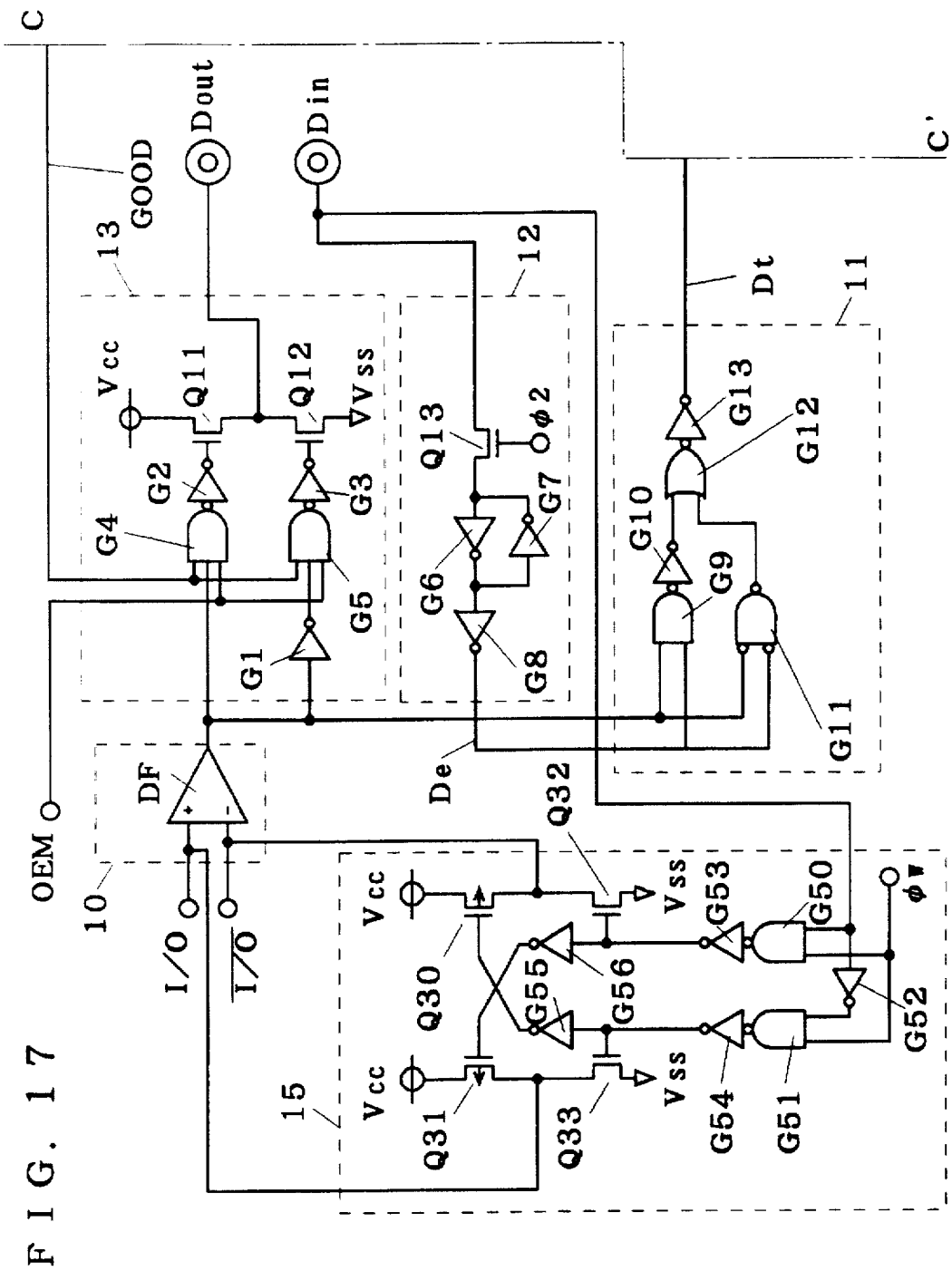
FIG. 17 is a circuit diagram illustrating the constitution of the fourth preferred embodiment of the semiconductor memory device of the invention.
Figure 18:
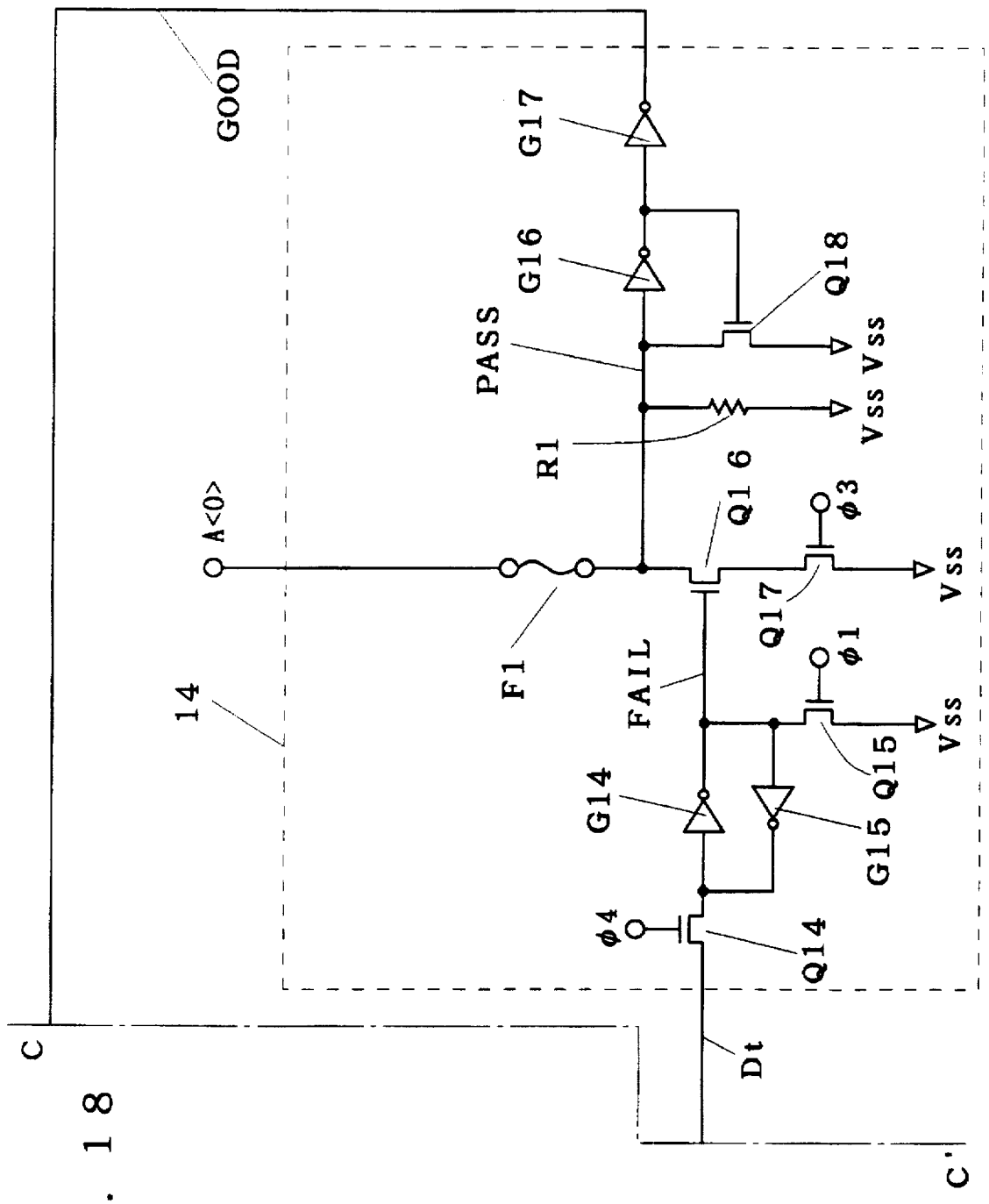
FIG. 18 is a circuit diagram illustrating the constitution of the fourth preferred embodiment of the semiconductor memory device of the invention.

FIG. 16 shows the constitution of the DRAM chip M100C. Herein, the same parts as in the DRAM chip M100 explained in FIG. 1 are identified with same reference numerals, and duplicate explanations are omitted. In FIG. 16, the expected value holding circuit 12 and write circuit 15 are connected to the Din pin which is the data input terminal, instead of the DQ pin, and the output buffer 13 is connected to the Dout pin, which is the data output terminal, instead of the DQ pin, and all others are same as in the DRAM chip M100 explained in FIG. 1. FIG. 17 and FIG. 18 show the constitution of the DRAM chip M100C as circuit diagrams. FIG. 17 and FIG. 18 are coupled together along line CC'.

<L-1. OEM Signal Generating Circuit>

Figure 19:
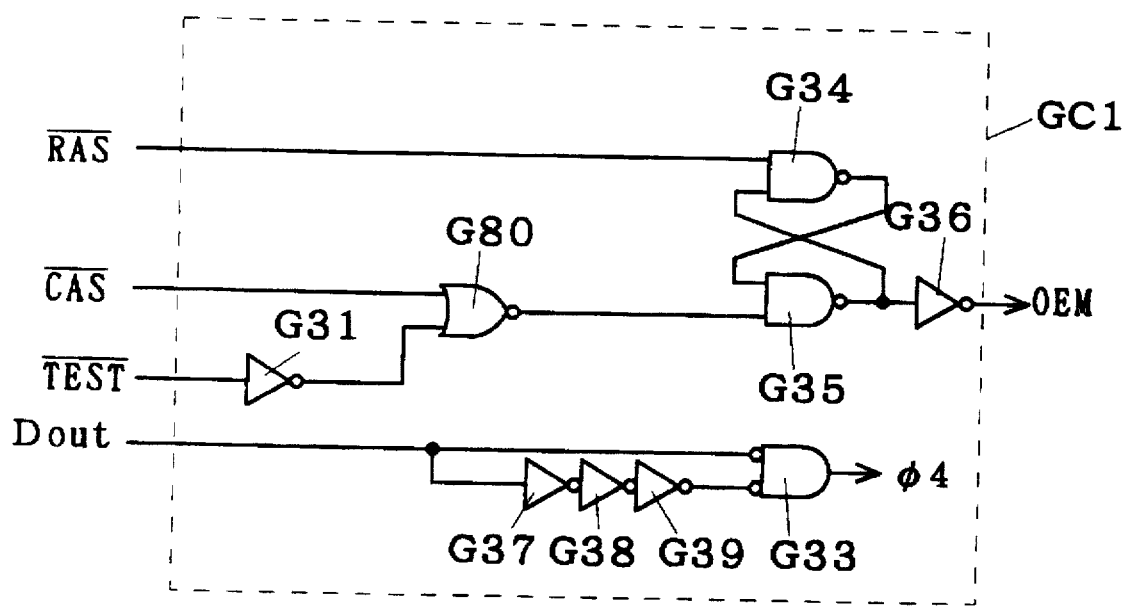
FIG. 19 is a circuit diagram illustrating the constitution of OEM signal generating circuit of the fourth preferred embodiment of the semiconductor memory device of the invention.
Figure 20:
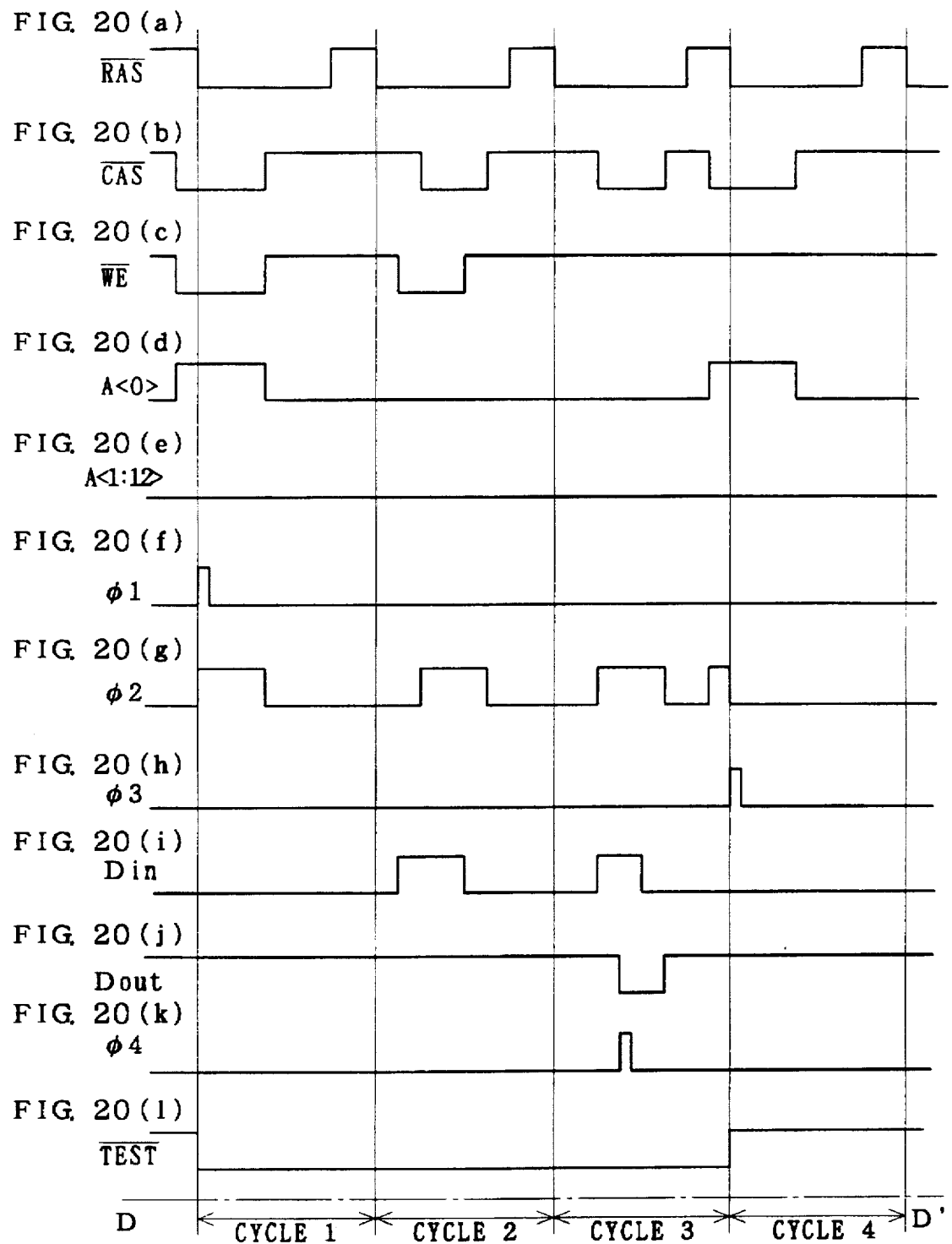
FIG. 20(a)–FIG. 20(l) are timing charts of parallel test according to the fourth preferred embodiment of the semiconductor memory device of the invention.
Figure 21:
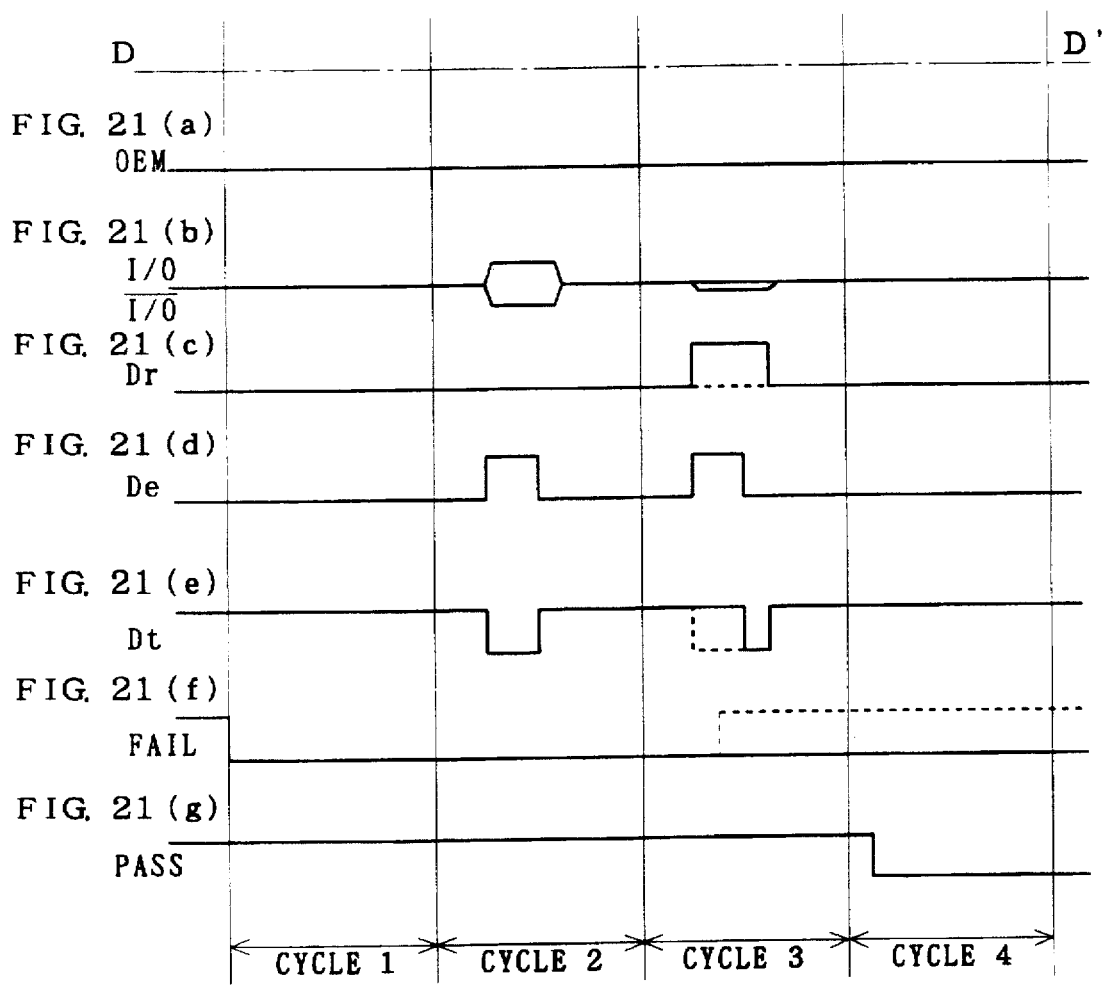
FIG. 21(a)–FIG. 21(g) are timing charts of parallel test according to the fourth preferred embodiment of the semiconductor memory device of the invention.

Herein, the DRAM chip M having Dout pin and Din pin does not require /OE pin for specifying whether to use the DQ in for input or for output, and therefore the OEM signal generating circuit GC1 for generating OEM signal and φ4 signal is constituted as shown in FIG. 19.

That is, the three-input NOR gate G32 of the OEM signal generating circuit GC explained in FIG. 4 is changed to the two-input NOR gate G80. The other constitution is same as in the OEM signal generator GC, and duplicate explanations are omitted.

<M. Parallel Test Action>

The test action of the DRAM chip M100C is explained by referring to the timing charts shown in FIG. 20(a)–FIG. 20(l) and FIG. 21(a)–FIG. 21(g), relating to parallel test. FIG. 20(a)–FIG. 20(l) and FIG. 21(a)–FIG. 21(g) are coupled together along line DD'.

In FIG. 20(a)–FIG. 20(l) and FIG. 21(a)–FIG. 21(g), the start and end of test mode, that is, cycle 1 and cycle 4 of /RAS signal are same as in the test action of the DRAM chip M100 explained in FIG. 6, and hence duplicate explanations are omitted.

<M-1. Cycle 2>

In cycle 2 of /RAS signal shown in FIG. 20(a)–FIG. 20(l) and FIG. 21(a)–FIG. 21(g), when the /RAS signal is changed to "L" and when the /CAS signal is changed to "L", the potential of the address pins A<0> to A<12> is "L". When the /WE signal becomes "L", the write cycle is specified. In this cycle, therefore, the "H" data applied to Din pin is written in the memory cell selected by the row address (A<0> to A<12>) and column address (A<0> to A<12>).

<M-2. Cycle 3>

In cycle 3, since the /WE signal is "H", it is read cycle, but the /TEST signal is "L", and therefore "H" is given to one of the inputs of the NOR gate G80 of the OEM signal generating circuit CG1 shown in FIG. 19, and the output of the NOR gate G80 is "L" whatever the other input may be, and t he output of the NAND gate G35 becomes "H", and the OEM signal becomes "L".

When the OEM signal is "L", the outputs of the NAND gates G4 and G5 of the output buffer 13 shown in FIG. 17 are "H" whatever the other input may be. To the gate electrodes of the N type MOSFETs Q11 and Q12, the outputs of the NAND gates g4 and G5 are given respectively through the inverters G2 and G3, so that the N type MOSFETs Q11 and Q12 are both in non-conductive state, and the output buffer 13 is set in high impedance state.

Therefore, in cycle 3, the expected value De of the data being readout from the tester 80 can be given to the DRAM chip M100C through the Dout pin.

The expected value holding circuit 12 has a latch circuit composed of inverters G6 and G7, and the expected value De of the read data given to the Dout pin is transferred to the latch circuit in the "H" period of the signal φ2. The expected value De of the readout outputted from the latch circuit is given to the comparator 11,and is compared with the read data Dr outputted from the read circuit 10.

Herein, with the expected value De of "H", when the read data Dr is "H", it means normal action, and the comparative result Dt outputted from the comparator 11 is "H". In the event of wrong action due to some cause, when the read data Dr becomes "L", the comparative result Dt is "L".

The comparative result Dt is given to the comparative result holding circuit 14 shown in FIG. 18, but the N type MOSFET Q14 is provided at the input unit of the comparative result holding circuit 14. To the gate electrode of the N type MOSFET Q14, when the Dout pin becomes "L", the signal φ4 becoming "H" only for the portion of delay time by the inverters G37, G38, G39 connected in series shown in FIG. 19 is given.

The comparative result Dt is transferred to the latch circuit composed of the inverters G14 and G15 of the comparative result holding circuit 141 for the "H" period of the signal φ4. The output of the latch circuit (FAIL signal) is reset to "L" through the N type MOSFET Q15 by the signal φ1 becoming "H" for a specific period, when getting in the test mode, but it is set to "H" when the comparative result Dt becomes "L", that is, when a wrong action occurs.

<N. Action and Effect>

By constituting as explained above, the output buffer is connected to the Dout pin, and the write circuit, to the Din p in, respectively, and the DRAM chip not having /OE pin can incorporate the test mechanism, so that the scope of the application of the invention may be extended.

<O. Modified Example>

In the fourth preferred embodiment of the semiconductor memory device of the invention described herein, in FIG. 16, the expected value holding circuit 12 is connected to the Din pin, but, instead, it may be connected to the Dout pin, and the expected value De may be given from the Dout pin during the test mode period.

In FIG. 19, meanwhile, the signal φ4 is generated on the basis of the Dout signal, but it may be also constituted to generate the φ4 signal on the basis of the Din signal.

<Fifth Preferred Embodiment>

Although the DRAM chips M100 to M100C of the first to fourth preferred embodiments have the constitutions to store one-bit data at a specified address signal as discussed above, in general, a semiconductor device practically processes multi-bit data which is specified by an address signal. Therefore, a semiconductor memory device has a plurality of I/O line pairs. That is to say, each of the I/O line pair has the constitution which is connected to one set of line pair, such as the one shown in FIG. 1. Also in the above preferred embodiments discussed is the constitution where the specific route is cut off by melting down the fuse element or bringing the floating gate transistor into an off-state to hold the result of comparison in a non-volatile manner only in the event of wrong action of the DRAM chip during the test mode period. Naturally, there may be a constitution where the specific route is cut off through the route cut-off element (the fuse element or the floating gate transistor) to hold the result of comparison in a non-volatile manner only in the event of no wrong action of the DRAM chip during the test mode period.

As the fifth preferred embodiment discussed below is the constitution of the semiconductor memory device for storing multi-bit data, where the fuse element is melted in the event of no wrong action of the DRAM chip during the test mode period.

Figure 22:
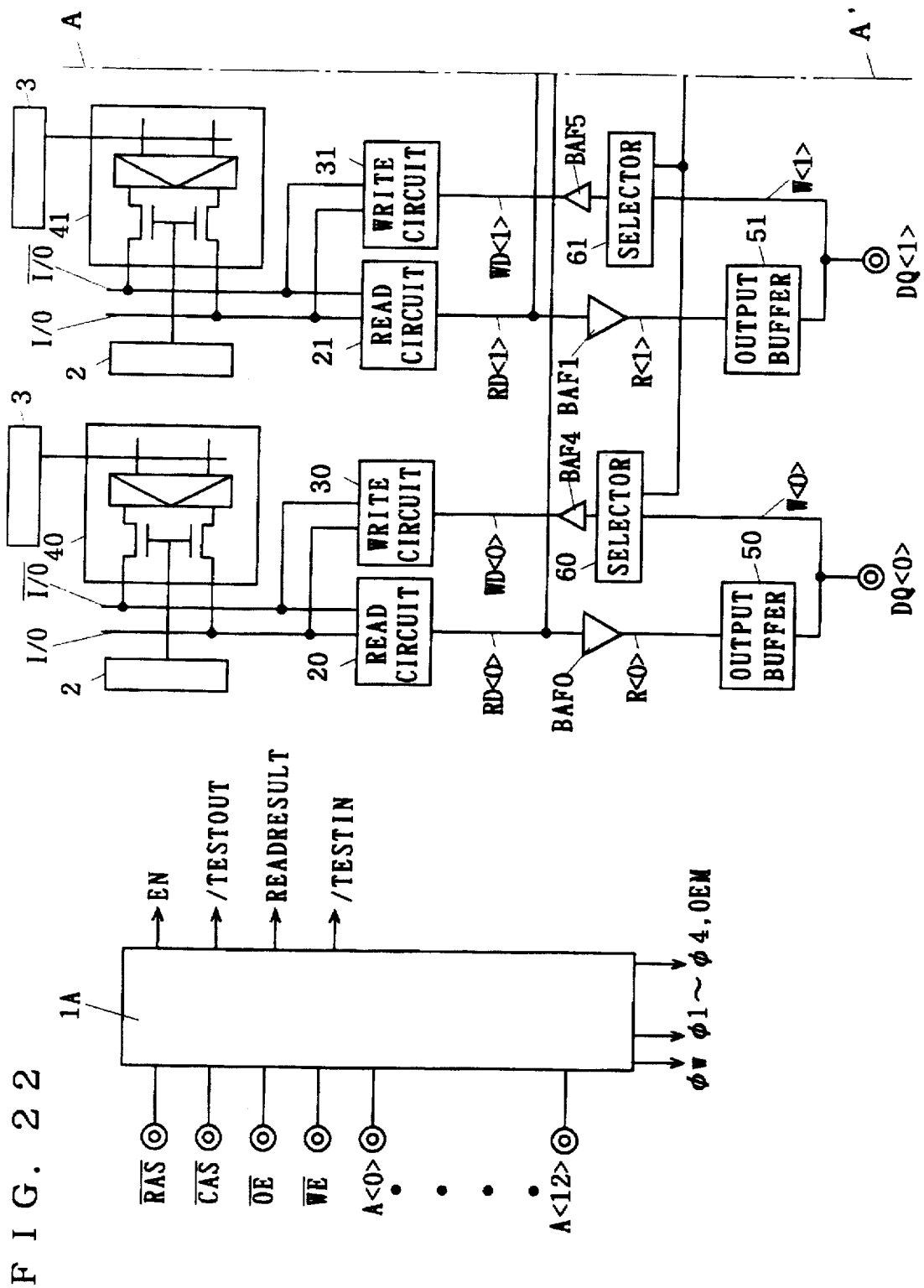
FIGS. 22 and 23 are block diagrams illustrating the constitution of a fifth preferred embodiment of a semiconductor memory device of the invention.
Figure 23:
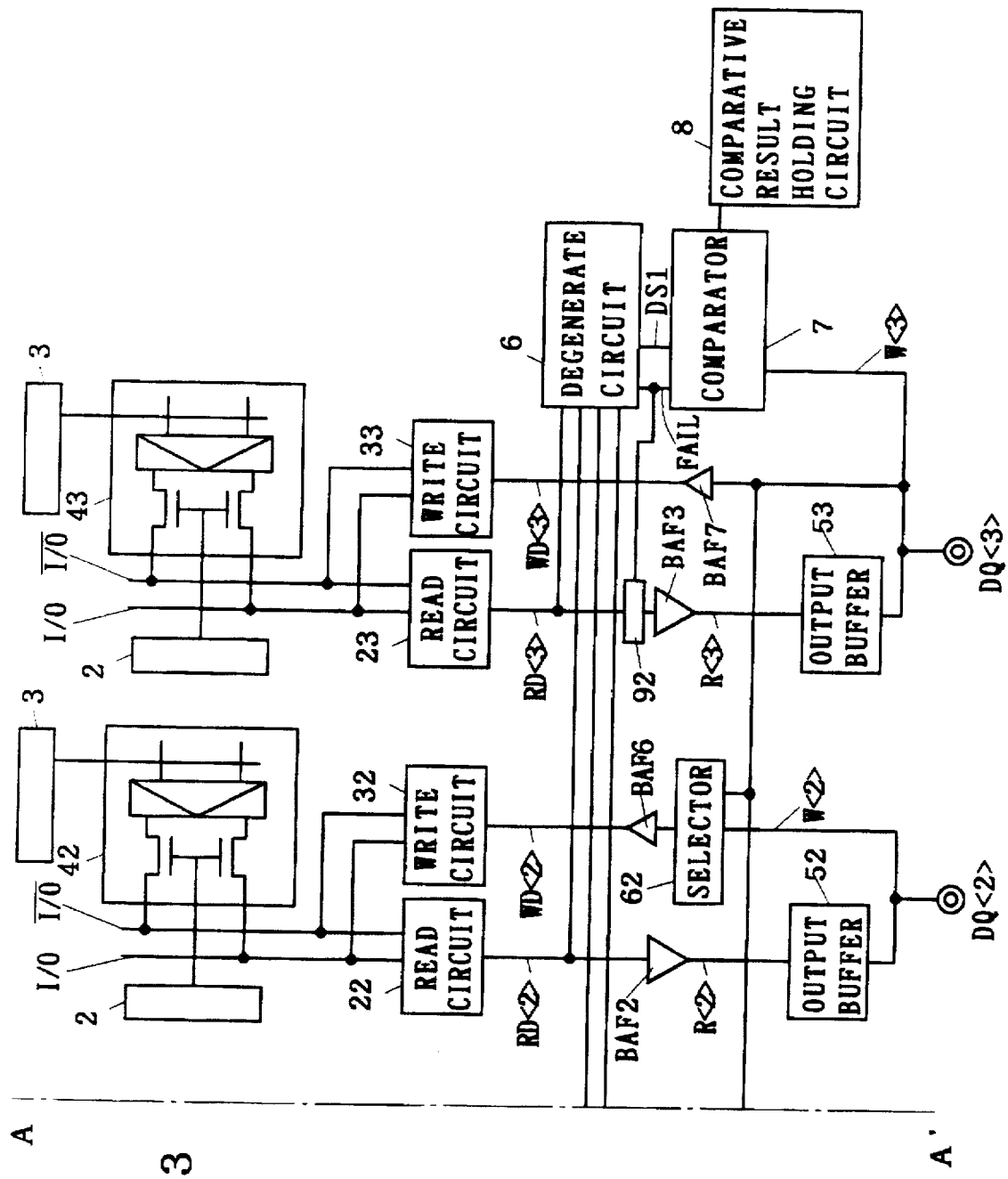

FIGS. 22 and 23 are block diagrams illustrating a constitution of a DRAM chip M200 incorporating the test mechanism. The DRAM chip M200 of FIGS. 22 and 23 has a constitution to store four-bit data. FIGS. 22 and 23 are coupled together at line AA'.

<P. Device Constitution>

In FIGS. 22 and 23, the DRAM chip 200 comprises, same as in the prior art, a control circuit 1A having a /RAS pin, a /CAS pin, a /OE pin, a /WE pin, and address signal pins A<0> to A<12>, four memory cell arrays 40 to 43, and a column address decoders 2 and a row address decoders 3 connected to the memory cell arrays 40 to 43 individually.

Read circuits 20 to 23 and Write circuits 30 to 33 are connected to the memory cell arrays 40 to 43 respectively through the /I/O wire and the I/O wire. Read data buses RD<0> to RD<3> are connected to the read circuits 20 to 23 respectively. Further, buffers BAF0 to BAF3 are connected to the read data buses RD<0> to RD<3> respectively, for transmitting read data through the read data buses RD<0> to RD<3>. Output buffers 50 to 53 are also connected to the read data buses RD<0> to RD<3> respectively, for outputting the read data transmitted by the buffers BAF0 to BAF3 to DQ pins DQ<0> to DQ<3>.

A degenerate circuit 6 is connected to all of the read data buses RD<0> to RD<3>, for degenerating the read four-bit data which are read out into one-bit data. A comparator 7 is connected to the degenerate circuit 6, for comparing the degenerated data with the expected value, and a comparative result holding circuit 8 is connected to the comparator 7, for holding the result of comparison from the comparator 7.

Herein, reducing the number of data through commonality of a plurality of data, as discussed later, is termed "degeneracy".

Further, a data bus switching circuit 92 is connected to the read data bus RD<3>, and the result of comparison from the degenerate circuit 6 can be thereby read out through the DQ pin DQ<3>, as discussed later.

Write data buses WD<0> to WD<3> are connected to the write circuits 30 to 33, respectively. Selectors 60 to 62 for selecting write data are connected to the write data buses WD<0> to WD<2>. DQ pins DQ<0> to DQ<2> are connected to respective one inputs of the selectors 60 to 62 through the write data buses WD<0> to WD<2>. The write data bus WD<3> is connected to an output of a buffer BAF7, and an input of the buffer BAF7 is connected to a DQ pin DQ<3> through a write bus W<3>. The write bus W<3> is connected in common to the respective other inputs of the selectors 60 to 62.

Figure 24:
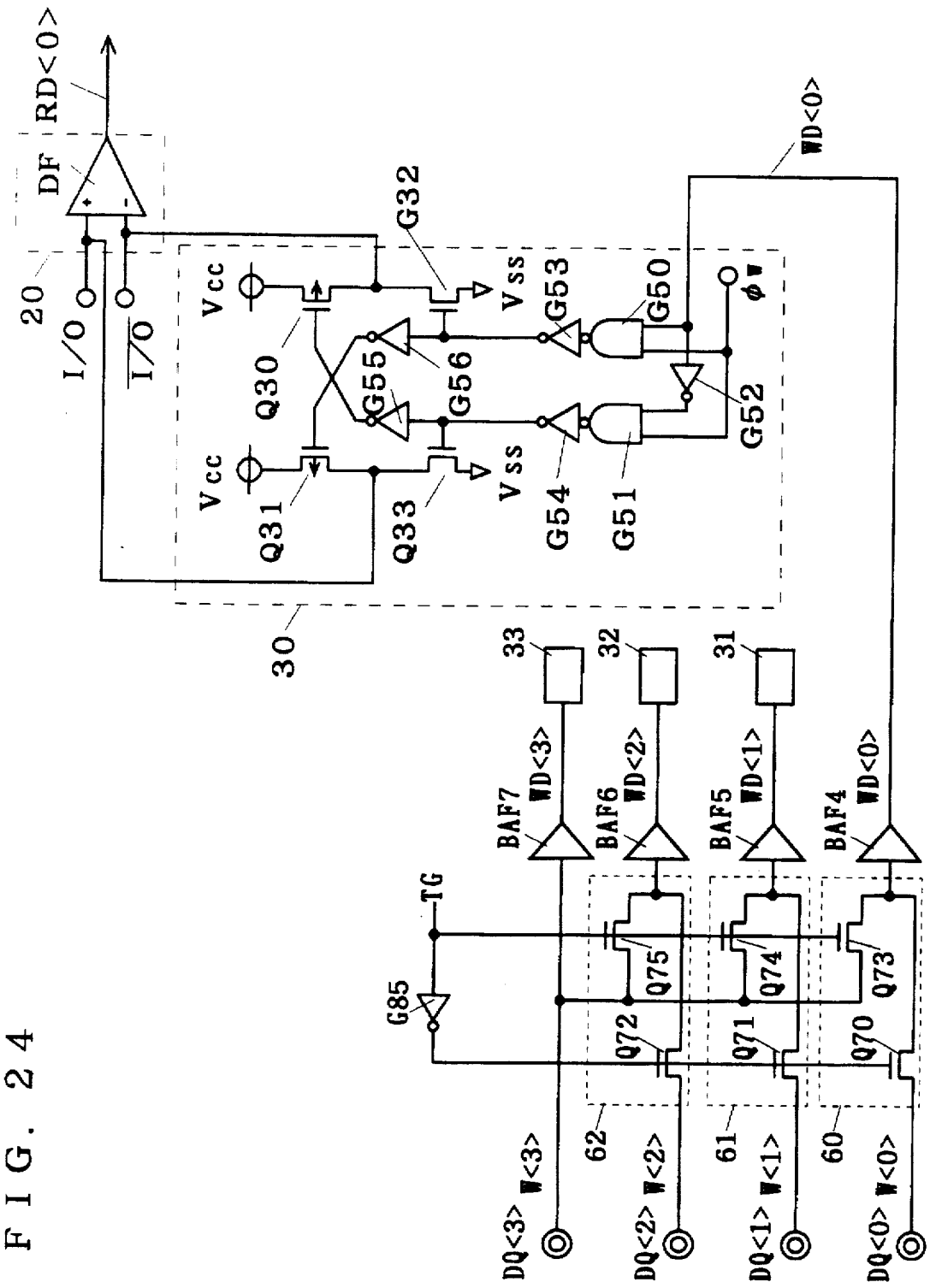
FIGS. 24 to 26 are circuit diagrams illustrating the constitution of the fifth preferred embodiment of the semiconductor memory device of the invention.
Figure 25:
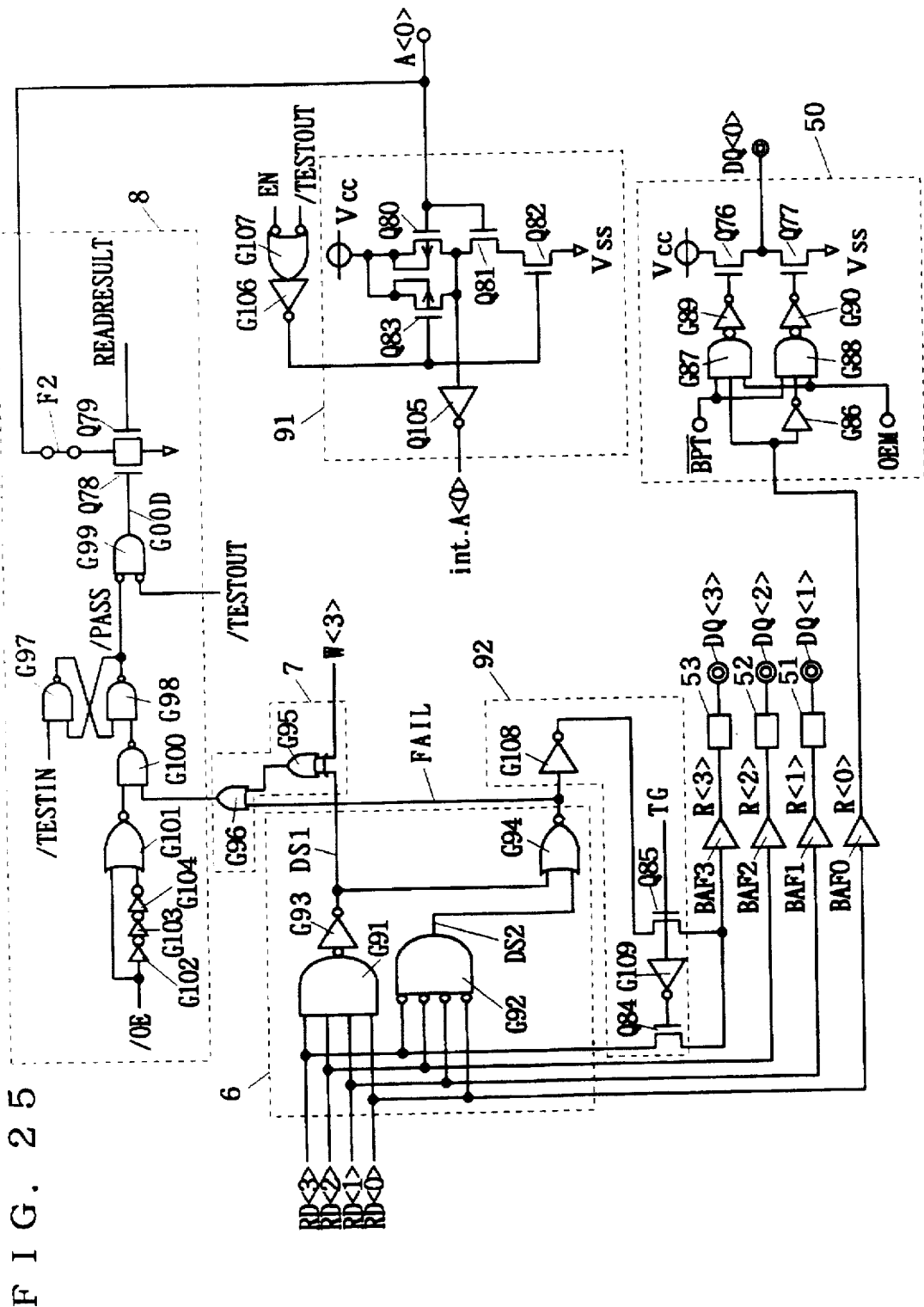
Figure 26:
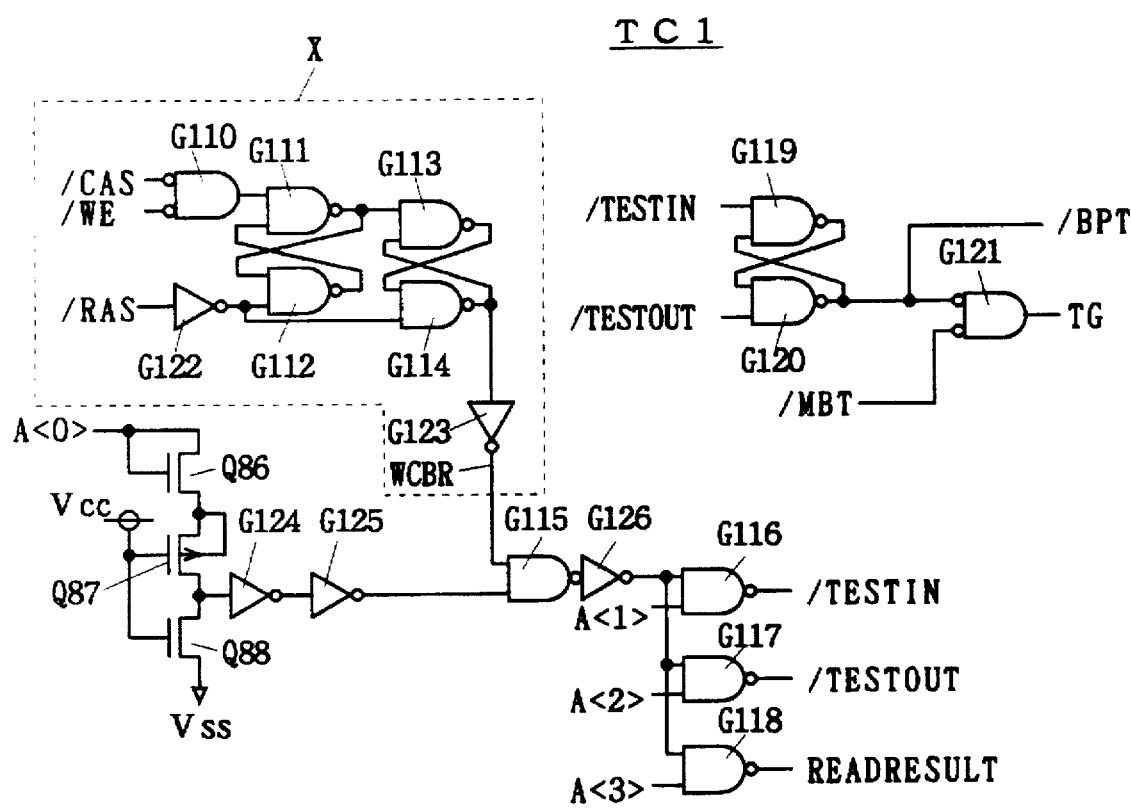
Figure 27:
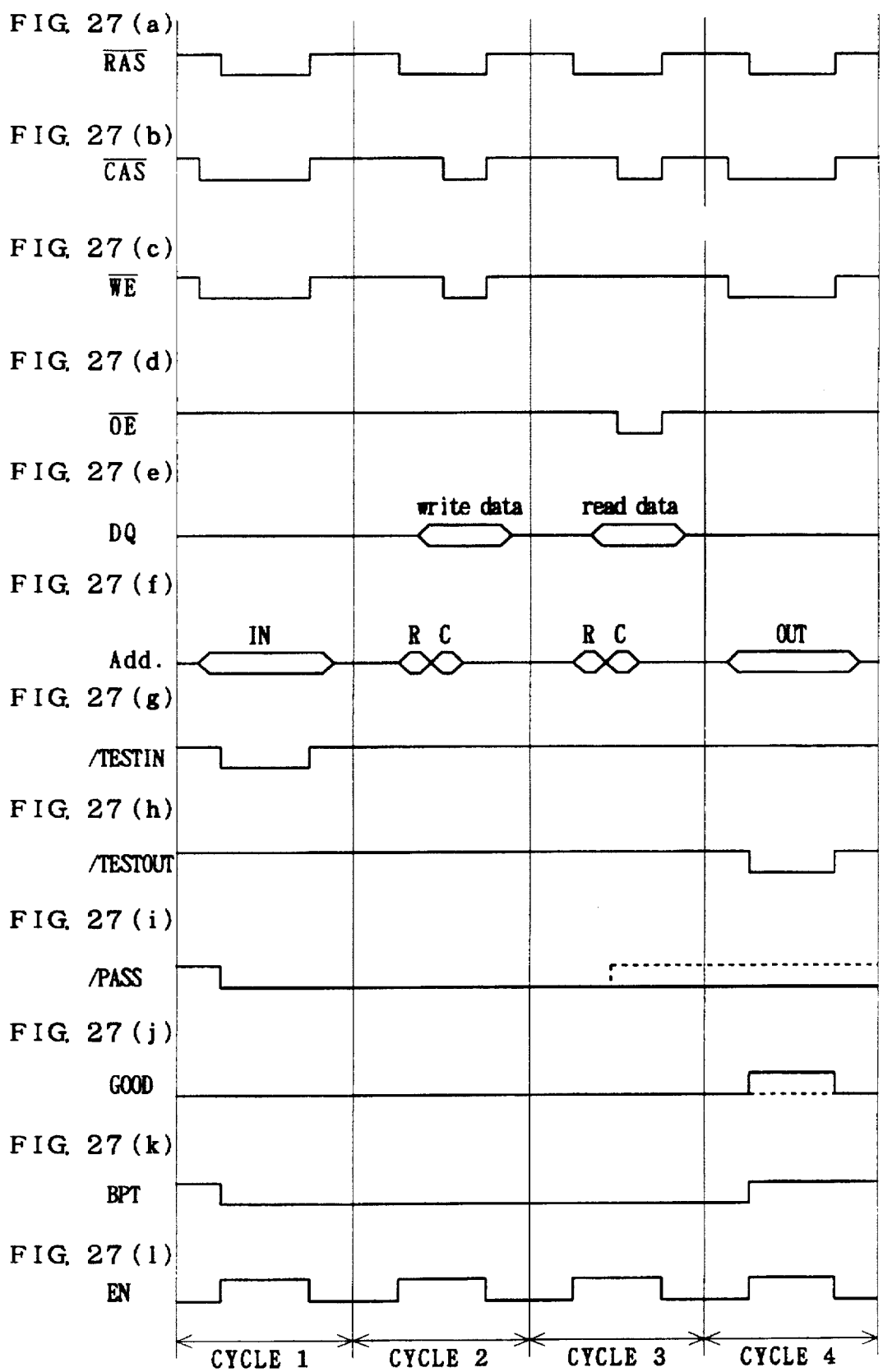
FIG. 27(a)–FIG. 27(l) are timing charts of parallel test according to the fifth preferred embodiment of the semiconductor memory device of the invention.

Referring to FIGS. 24 to 26 discussed are the constitutions of the control circuit 1A, the read circuits 20 to 23, the write circuit 30 to 33, the output buffers 50 to 53, the selectors 60 to 62, the degenerate circuit 6, the comparator 7 and the comparative result holding circuit 8.

<P-1. Read Circuit>

As shown in FIG. 24, the read circuit 20 is the same as the read circuit 10 of FIG. 2, being implemented with the differential amplifier DF. The output of the differential amplifier DF is connected to the read data bus RD<0>. Furthermore, the read circuits 21 to 23 (not shown) each have the same constitution, and the respective outputs of differential amplifiers DF are connected to the read data buses RD<1> to RD<3>, respectively.

<P-2. Write Circuit>

As shown in FIG. 24, the write circuit 30 is the same as the read circuit 15 of FIG. 2, and duplicate discussion will be omitted. The data bus WD<0> is connected to the input of the NAND gate G50 and the write data bus WD<0> is connected to a buffer BAF4s of the selector 60. Furthermore, the write circuits 31 to 33 each have the same constitution, and the write data buses WD<1> to WD<3> are connected to the respective inputs of NAND gates G50, respectively.

<P-3. Selector>

As shown in FIG. 24, the selector 60 has an N type MOSFET Q70 of which the drain electrode is connected to the write bus W<0> and the source electrode is connected to the buffer BAF4 and an N type MOSFET Q73 of which the drain electrode is connected to the write bus W<3> and the source electrode is connected to the buffer BAF4. Furthermore, the output of the buffer BAF4 is connected to the write data bus WD<0>.

The selector 61 has an N type MOSFET Q71 of which the drain electrode is connected to the write bus W<1> and the source electrode is connected to the buffer BAF5 and an N type MOSFET Q74 of which the drain electrode is connected to the write bus W<3> and the source electrode is connected to the buffer BAF5. Furthermore, the output of the buffer BAF5 is connected to the write data bus WD<1>.

The selector 62 has an N type MOSFET Q72 of which the drain electrode is connected to the write bus W<2> and the source electrode is connected to the buffer BAF6 and an N type MOSFET Q75 of which the drain electrode is connected to the write bus W<3> and the source electrode is connected to the buffer BAF6. Furthermore, the output of the buffer BAF6 is connected to the write data bus WD<2>.

The respective gate electrodes of N type MOSFETs Q70 to Q72 are connected to an output of an inverter G85 for receiving a test gate signal (hereinafter, referred to as "TG signal") and the respective gate electrodes of N type MOSFETs Q73 to Q75 are connected to an input of an inverter G85. Furthermore, the output of the buffer BAF7 is connected to the write data bus WD<3>.

<P-4. Output Buffer>

As shown in FIG. 25, the output buffer 50 has N type MOSFETs Q76 and Q77 connected in series between the power source potential $V_{CC}$ and the grounding potential $V_{SS}$, an inverter Q86, three-input NAND gates G87 and G88 and inverters G89 and G90.

A common connection node of the N type MOSFETs Q76 and Q77 is connected to the DQ pin DQ<0>. An output of the inverter Q89 is connected to the gate electrode of N type MOSFET Q76 and an output of the three-input NAND gate G87 is connected to an input of the inverter Q89. A BPT(/BPT hereinafter) signal, the OEM signal and a signal from the read bus R<0> (i.e., a read signal) are applied to an input of the three-input NAND gate G87.

An output of the inverter G90 is connected to the gate electrode of N type MOSFET Q77 and an output of the three-input NAND gate G88 is connected to an input of the inverter G90. The /BPT signal, the OEM signal and an output of the inverter G86 are applied to an input of the three-input NAND gate G88. The signal from the read bus R<0> (i.e., the read signal) are applied to an input of the inverter G86. Furthermore, the output buffers 51 to 53 each have the same constitution and duplicate discussion will be omitted.

<P-5. Degenerate Circuit>

As shown in FIG. 25, the degenerate circuit 6 has a four-input NAND gate G91 and an inverted four-input AND gate G92 both of which receive the read data buses RD<0> to RD<3>, an inverter G93 connected to an output of the four-input NAND gate G91 and a NOR gate G94 receiving an output of the inverted four-input AND gate G92.

<P-6. Comparator>

As shown in FIG. 25, the comparator 7 has an exclusive OR (XOR) gate G95 and an OR gate G96, an output of the inverter G93 in the degenerate circuit 6 is connected to one input of the XOR gate G95 and the write bus W<3> is connected to the other input thereof.

An output of the XOR gate G95 is connected to one input of the OR gate G96 and an output of the NOR gate G94 in the degenerate circuit 6 is connected to the other input thereof.

<P-7. Comparative Result Holding Circuit>

As shown in FIG. 25, the comparative result holding circuit 8 has NAND gates G97, G98 and G100, an inverted input AND gate G99, a NOR gate G101, inverters G102 to G104, N type MOSFETs Q78 and Q79 and a fuse element F2.

The NAND gates G97 and G98 constitute a reset/set flip-flop. An output of the NAND gate G98 is connected to one input of the inverted AND gate G99, an output of the OR gate G96 in the comparator 7 is connected to one input of the NAND gate G100, an output of the NAND gate G100 is connected to an input of the NAND gate G98, and an output of the NOR gate G101 is connected to the other input of the NAND gate G100.

The /OE signal is inputted to one input of the NOR gate G101 and an inverted /OE signal through the serially-connected inverters G102 to G104 is inputted to the other input of the NOR gate G101. The NAND gate G97 receives a $\overline{\text{TESTIN}}$ (/TESTIN) signal indicating entry into the test mode and the other input of the inverted input AND gate G99 receives a $\overline{\text{TESTOUT}}$ (/TESTOUT) signal indicating exit from the test mode.

The drain electrodes of N type MOSFETs Q78 and Q79 are connected in common to one end of the fuse element F2 and the source electrodes thereof are connected in common to the grounding potential $V_{SS}$. An output of the inverted input AND gate G99 is connected to the gate of N type MOSFET Q78 and a READRESULT signal used for checking the test result is connected to the gate electrode of N type MOSFET Q79. The other end of the fuse element F2 is connected to the address signal pin A<0>.

<P-8. Address Buffer>

As shown in FIG. 25, an address buffer 91 is connected to the address signal pin A<0>. The address buffer 91 comprises a P type MOSFET Q80, N type MOSFETs Q81 and Q82, which are connected in series between the power source potential $V_{CC}$ and the grounding potential $V_{SS}$, a P type MOSFET Q83 of which the drain electrode is connected to the drain electrode of P type MOSFET Q80 and an inverter G105 whose input is connected to the drain electrodes of P type MOSFETs Q80 and Q83. The address signal pin A<0> is connected to the gate electrode of P type MOSFET Q80 and N type MOSFET Q81, and an output of the inverter Q105 is connected to an internal circuit (not shown).

The gate electrodes of N type MOSFET Q82 and P type MOSFET Q83 are connected to an output of an inverter G106. An inverted input OR gate G107 has an output connected to an input of the inverter G106 and an input to which an address buffer activating signal (hereinafter referred to as "EN signal") and the /TESTOUT signal are connected.

<P-9. Read Data Bus Switching Circuit>

As shown in FIG. 25, the read data bus switching circuit 92 is connected to the read data bus RD<3>. The read data bus switching circuit 92 has an inverter G108 connected to an output of the NOR gate G94 in the degenerate circuit 6, an N type MOSFET Q84 inserted in the read data bus RD<3>, an N type MOSFET Q85 of which the drain electrode is connected to an output of the inverter G108 and the source electrode is connected to the read data bus RD<3> and an inverter G109. The TG signal is inputted to an input of the inverter G109 and the gate electrode of N type MOSFET Q85, and an output of the inverter G109 is connected to the gate electrode of N type MOSFET Q85.

<P-10. Test Control Circuit>

Referring next to FIG. 26, a constitution of a test control circuit TC1 included in the control circuit 1A will be discussed. The test control circuit TC1 outputs the /TESTIN signal, the /TESTOUT signal, the READRESULT signal and the TG signal for controlling the test mechanism of the DRAM chip M200. Now, the test control circuit TC1 can be referred as a mode setting means since it outputs a signal relating to a switching of the mode as explained above.

As shown in FIG. 26, the test control circuit TC1 has inverted AND circuits G110 and G121, NAND gates G111 to G120, inverters G122 to G126 and N type MOSFETs Q86 to 88.

The NAND gates G111 and G112 constitute a reset/set flip-flop and an output of the NAND gate G111 is connected to an input of the NAND gate G113.

The NAND gates G113 and G114 constitute a reset/set flip-flop and an output of the NAND gate G114 is connected to an input of the inverter G123. An output of the inverter G123 is connected to one input of the NAND gate G115.

The /CAS signal terminal and the /WE signal terminal are connected to the inverted AND gate G110 and an output thereof is connected to an input of the NAND gate G111. The /RAS signal terminal is connected to an input of the inverter G122 and an output thereof is connected to an input of the NAND gate G112 and an input of the NAND gate G114.

The N type MOSFET Q86, the P type MOSFET Q87 and the N type MOSFET Q88 are connected in series in this order. The address pin A<0> is connected to the drain electrode and the gate electrode of N type MOSFET Q86 and the source electrode of N type MOSFET Q88 is connected to the grounding potential $V_{SS}$. The gate electrodes of P type MOSFET Q87 and N type MOSFET Q88 are connected to the power source potential $V_{CC}$ and the back gate of P type MOSFET Q87 is connected to the source electrode thereof. The drain electrode of P type MOSFET Q87 is connected to an input of the inverter G124, an output thereof is connected to an input of the inverter G125, and an output thereof is connected to the other input of the NAND gate G115.

An output of the NAND gate G115 is connected to an input of the inverter G126 and an output thereof is connected to respective one inputs of the NAND gates G116, G117 and G118. An address pin A<1> is connected to the other input of the NAND gate G116, and the NAND gate G116 outputs the /TESTIN signal. An address pin A<2> is connected to the other input of the NAND gate G117, and the NAND gate G117 outputs the /TESTOUT signal. An address pin A<3> is connected to the other input of the NAND gate G118, and the NAND gate G118 outputs a READRESULT signal.

The NAND gates G119 and G120 constitute a reset/set flip-flop. The /TESTIN signal is applied to an input of the NAND gate G119 and the /TESTOUT signal is applied to an input of the NAND gate G120.

An output of the NAND gate G120 is connected to one input of the inverted input AND gate G121 and is outputted as /BPT signal. A $\overline{\text{MBT}}$ (hereinafter /MBT) signal is applied to the other input of the inverted input AND gate G121 and the inverted input AND gate G121 outputs the TG signal.

<Q. Multi-bit Test Operation>

Now, reading and writing test of the DRAM chip M200 will be discussed. As mentioned earlier, the DRAM chip M200 has memory cell arrays 40 to 43 to store four-bit data at a specified address signal. Accordingly, the reading and writing test should be conducted with respect to the memory cell arrays 40 to 43. That is generally termed "multi-bit test".

The multi-bit test will be discussed below, referring to FIGS. 24 to 26 and FIG. 27(a)–FIG. 27(l) showing a timing chart of test operation of the DRAM chip M200. In FIG. 27(a)–FIG. 27(l), the broken line indicates the action in the event of wrong operation, and the solid line indicates the normal action.

Furthermore, in the multi-bit test, a tester gives signals to a plurality of DRAM chips, like in the case of testing one-bit data as discussed with reference to FIG. 6.

<Q-1. Cycle 1>

First, in cycle 1 of the /RAS signal shown in FIG. 27(a)–FIG. 27(l), the operation mode of the DRAM chip M200 is changed from ordinary mode to test mode (Test Mode In). A change of mode from the ordinary mode to the test mode is made as follows. Prior to change from "H" to "L" of the /RAS signal, the /CAS signal and the /WE signal are changed from "H" to "L". The value of the address pin A<0> is set at $V_{CC} + 3|V_{THP}|$ or more (where $V_{THP}$ is the threshold value of the P type MOSFET) to apply "H" to the address pin A<1>. Thus, the /TESTIN signal becomes "L" at the timing of change of the /RAS signal from "H" to "L", and the switching into the test mode is accomplished.

When the value of the address pin A<0> becomes $V_{CC}+3|V_{THP}|$, the N type MOSFET Q86 and the P type MOSFET Q87 becomes conducting and the N type MOSFET Q88 becomes conducting, and then a voltage develops across the N type MOSFET Q88 through an ON-resistance to give a potential of "H" at the drain electrode of N type MOSFET Q88.

When the value of the address pin A<0> is equal to $V_{CC}$ or less, neither the N type MOSFET Q86 nor the P type MOSFET Q87 becomes conducting and the potential of the drain electrode of N type MOSFET Q86 becomes "L".

Furthermore, in FIG. 26, when the address pin A<1> is applied "H", the address pins A<2> and A<3> are applied "L" and the /TESTOUT signal and the READRESULT signal become "H". When the /TESTIN signal becomes "L", the /TESTOUT signal becomes "H" and accordingly the /BPT signal becomes "L".

When the /RAS signal, the /CAS signal and the /WE signal become "H", the /TESTIN signal also becomes "H". Even when the /TESTIN signal becomes "H", the /BPT signal indicating the state of parallel test holds "L".

Then, since the /MBT signal indicating the state of multi-bit test is "L", the TG signal outputted from the inverted input AND gate G121 becomes "H".

In this cycle, the /OE signal is "H", an output of the NAND gate G98 (hereinafter, referred to as "$\overline{PASS}$ (/PASS) signal") in the comparative result holding circuit 8 becomes "L".

<Q-2. Cycle 2>

In cycle 2 of the /RAS signal (Write Cycle), since the TG signal is "H", the N type MOSFETs Q70 to Q72 and the N type MOSFETs Q73 to Q75 in the selectors 60 to 62 shown in FIG. 24 are brought into an OFF-state and an ON-state, respectively, and then the write data from the DQ pin DQ<3> are transmitted through the N type MOSFETs Q73 to Q75 to the write data buses WD<0> to WD<2> and hence applied to the memory cell arrays 40 to 43. Accordingly, the values of the write data buses WD<0> to WD<3> all become "H" or all become "L".

During the test mode, the /BPT signal and OEM signal are "L", the N type MOSFETs Q76 and Q77 become non-conducting and the output buffers 50 to 53 are brought into high impedance state. Thus, no signal is outputted.

<Q-3. Cycle 3>

In cycle 3 of the /RAS signal (Read Cycle), the /WE signal becomes "H", indicating a read cycle, the data written into the memory cell arrays 40 to 43 are read out and transmitted to the read data buses RD<0> to RD<3> through the read circuits 20 to 23.

When no wrong action takes place in reading or writing, the values of the read data buses RD<0> to RD<3> all become "H" or all become "L". Since the read data buses RD<0> to RD<3> are connected to the four-input NAND gate G91 and the inverted four-input AND gate G92 in the degenerate circuit 6 shown in FIG. 25, in the event of no wrong action, the output of the four-input NAND gate G91 becomes "L" or "H" and then it is inverted by the inverter G93 and outputted. The output signal is referred to as "a degenerate signal DS1". The output of the four-input NOR gate G92 (referred to as "a degenerate signal DS2") becomes "L" or "H" but does not coincide with the degenerate signal DS1.

Thus, "degeneracy" means reduction in the number of data through commonality of plural data. Through commonality of plural data on whether all the data are "H" or "L", the data are outputted as "H" or "L" from the four-input NAND gate G91 or the four-input NOR gate G92.

After that, the degenerate signal DS1 is compared with the expected value, i.e., the value of the write bus W<3> in the XOR gate G95. When no wrong action takes place, the values of the read data buses RD<0> to RD<3> coincide with the value of the write bus W<3>, and the degenerate signal DS1 coincides with the values of the read data buses RD<0> to RD<3>. Therefore, the output of the XOR gate G95 becomes "L".

When no wrong action takes place, the degenerate signals DS1 and DS2 do not coincide with each other and therefore the output of the NOR gate G94 (hereinafter, referred to as "FAIL signal") becomes "L".

Accordingly, the output of the OR gate 96, which receives the output of the XOR gate G95 and the FAIL signal, becomes "L". Therefore, even if the /OE signal becomes "L" in the comparative result holding circuit 8, the /PASS signal remains "L".

When a wrong action takes place in reading or writing, both the degenerate signals DS1 and DS2 become "L". The degenerate signal DS1 is compared with the expected value, i.e., the value of the write bus W<3>, in the XOR gate G95. When the degenerate signal DS1 and the value of the write bus W<3> do not coincide with each other and both the degenerate signals DS1 and DS2 are "L", i.e., in the event of wrong action, the output of the XOR gate G95 becomes "H".

Moreover, in the event of wrong action, both the degenerate signals DS1 and DS2 become "L" and the FAIL signal becomes "H". Therefore, the output of the OR gate G96 becomes "H".

When the output of the OR gate G96 becomes "H", the /PASS signal becomes "H" at the timing of change of the /OE signal from "H" to "L" in the comparative result holding circuit 8.

Furthermore, the result of comparison in the degenerate circuit 6 can be read out from the DQ pin DQ<3> through the read data bus switching circuit 92, and therefore a constitution where the result of comparison can be outputted from the DQ pin DQ<3>, with reference to the constitution of FIG. 9, would allow the individual judging.

<Q-4. Cycle 4>

In cycle 4 of the /RAS signal, the test mode is brought to an end (Test Mode Out). For this, the /CAS signal and the /OE signal should be brought into "L" before the /RAS signal becomes "L" and the potential at the address signal pin A<0> should be set at $V_{CC}+3|V_{THP}|$ or more. By giving "H" to the address signal pin A<2>, the /TESTOUT signal becomes "L" at the timing of change of the /RAS signal from "H" to "L" in the test control circuit TC1 shown in FIG. 26.

If no wrong action takes place during the test mode (i.e., in the cycles 2 and 3), since the /PASS signal remains "L", an output of the inverted AND gate G99 (hereinafter referred to as "GOOD signal") in the comparative result holding circuit 8 becomes "H" when the /TESTOUT signal becomes "L". The GOOD signal becomes "H" in the event of no wrong action and becomes "L" in the event of some wrong action, and therefore the GOOD signal is a signal which reflects the test result. Thus, ante-stage circuits including the inverted input AND gate G99 in the comparative result holding circuit 8 may be termed "test result output circuit".

Since the potential at the address pin A<0> is $V_{CC}+3|V_{THP}|$ or more, the fuse element F2 is melted with overcurrent flowing therein when the GOOD signal becomes "H" and the N type MOSFET Q78 becomes conducting.

On the other hand, if an wrong action takes place during the test mode, the GOOD signal is "L", even when the /TESTOUT signal becomes "L", since the /PASS signal becomes "H". Accordingly, the N type MOSFET Q78 does not become conducting and the fuse element F2 is not melted.

<R. Prevention of Breakdown of Input Buffer>

When the potential at the address signal pin A<0> is set at $V_{CC}+3|V_{THP}|$ or more and no wrong action takes place during the test mode, the fuse clement F2 is melted with overcurrent flowing therein. Since the address buffer 91 is connected to the address signal pin A<0>, there arises a need to protect transistors in the address buffer 91.

In the cycle 4, the /TESTOUT signal becomes "L". At this time, since the EN signal is "H", an output of the inverted input OR gate G107 becomes "H" and the output of the inverter G108 becomes "L", and accordingly the P type MOSFET Q83 becomes conducting.

When the P type MOSFET Q83 becomes conducting, the drain electrodes of P type MOSFET Q80 and N type MOSFET Q81 are brought into the power source potential $V_{CC}$. Therefore, even if the address signal pin A<0> is set at $V_{CC}+3|V_{THP}|$ or more, the voltages across gate oxide films of the P type MOSFET Q80 and the N type MOSFET Q81 become small, and both the transistors are prevented from breaking down.

Furthermore, in the cycles other than cycle 4, since the /TESTOUT signal is "H", by bringing the EN signal into "H", an output of the inverter G106 becomes "H" and the N type MOSFET Q82 becomes conducting, and thus the P type MOSFET Q80 and the N type MOSFET Q81 work as normal buffer to allow an address signal to be inputted by the address signal pin A<0>.

<S. Individual Judging Action>

After parallel test of plural DRAM chips by one tester in the above manner, a check as to whether any wrong action takes place or not with respect to an individual DRAM chip (hereinafter referred to as "individual judging") is made by the same tester.

Figure 28:
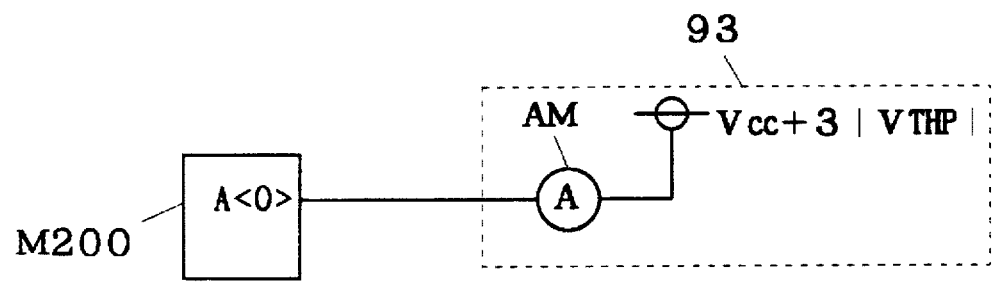
FIG. 28 is a structural diagram for individual judgement according to the fifth preferred embodiment of the semiconductor memory device of the invention.
Figure 32:
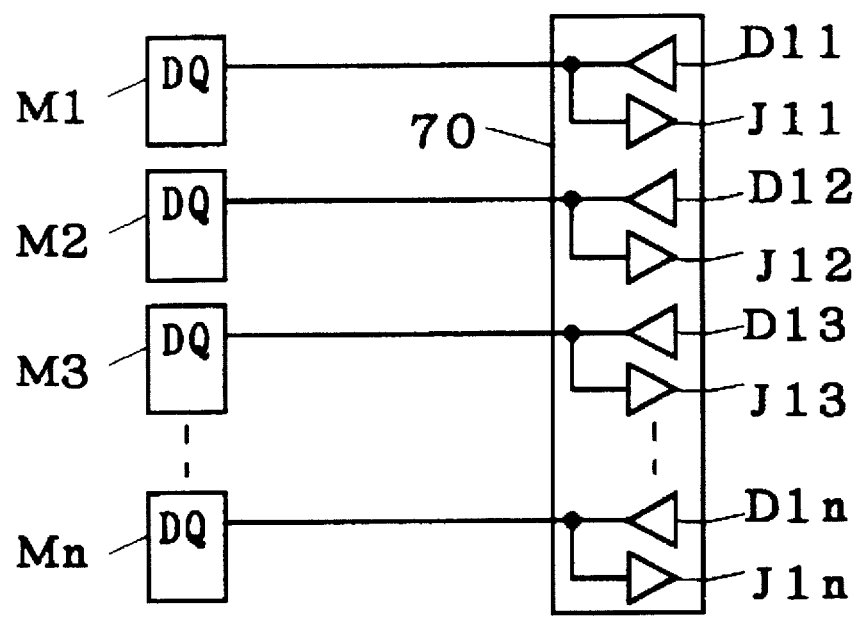
FIG. 32 is a structural diagram of parallel test by using a conventional semiconductor memory device.

FIG. 28 illustrates a constitution for performing the individual judging of the DRAM chip M200. In FIG. 28, a tester 93 includes an ammeter AM, and one end of the ammeter is connected to the address signal pin A<0> and the other end of the ammeter is connected to the potential of $V_{CC}+3|V_{THP}|$. Furthermore, between the tester 93 and the DRAM chip M200 disposed actually are routes for applying the specified signals to the /RAS pin, the /CAS pin, the /OE pin, the /WE pin and other address signal pins, other than the above route.

FIG. 29(a)–FIG. 29(g) shows the timing chart of checking the action of the DRAM chip M200. In FIG. 29(a)–FIG. 29(g), by changing the /CAS signal and the /WE signal from "H" to "L", setting the value of the address signal pin A<0> at $V_{CC}+3|V_{THP}|$ or more ($V_{THP}$ is a threshold value of P type MOSFET) and bringing the value of the address signal pin A<3> into "H" prior to the change of the /RAS signal from "H" to "L", the output of the AND gate G118, i.e., the READRESULT signal becomes "H" at the timing of the change of the /RAS signal from "H" to "L".

When the READRESULT signal becomes "H", the N type MOSFET Q79 in the comparative result holding circuit 8 of FIG. 25 becomes conducting. If the fuse element F2 is not melted (i.e., in the event of wrong action during the parallel test), there is a current flow from the address signal pin A<0> to the grounding potential $V_{SS}$, which is sensed by the ammeter AM of the tester 93.

On the other hand, the fuse element F2 is melted (i.e., in the event of no wrong action during the parallel test), there is no current flow from the address signal pin A<0> to the grounding potential $V_{SS}$.

Thus, the result of comparison is held in non-volatile manner depending on whether the fuse element F2 is melted or not, and presence or absence of wrong action can be detected depending on whether there is a current flow in the ammeter AM of the tester 93.

When the individual judging with respect to one DRAM chip M200 is over, the tester 93 is disconnected from the judged DRAM chip M200 and connected to another DRAM chip M200 to be judged individually in the same manner. Therefore, for n DRAM chips M200, the individual judging action is repeated n times.

One individual judging action takes approximately 0.5 seconds, so it takes approximately 50 seconds to perform the individual judgment for 100 DRAM chips M200, for example.

<T. Action and Effect>

As discussed above, in the semiconductor memory device of the fifth preferred embodiment of the present invention, multi-bit read data is degenerated into one-bit data and the one-bit data is compared with the expected value. Therefore, the comparator and the like are more simplified in the constitution as compared with a case where multi-bit data are individually compared, thereby reducing the size of the test mechanism.

Further, since the DRAM chip is designed so that the fuse element F2 is melted if no wrong action takes place during the parallel test, a DRAM chip which is not parallelly tested is prevented from being shipped as a DRAM chip which has caused no wrong action (hereinafter referred to as "pass chip").

Specifically, if a DRAM chip M200 to be parallelly tested is not placed in a specified test socket, it is not parallelly tested and naturally the fuse element F2 is not melted. Accordingly, since a current is sensed in the individual judging, the untested DRAM chip M200 is dealt with as a DRAM chip which has caused a wrong action in the parallel test.

Even when the address signal pin A<0> is applied the potential of $V_{CC}+3|V_{THP}|$ or more, the voltages across the gate oxide films of the P type MOSFET Q80 and the N type MOSFET Q81 in the address buffer 91 become smaller, and therefore both the transistors are prevented from breaking down. Thus, it is possible to avoid the disadvantage that no address signal can be written into the transistors during the ordinary operation.

<U. Modified Example>

The test control circuit TC1 of FIG. 26 has the reset/set flip-flop consisting of the NAND gates G11 and G112 and the reset/set flip-flop consisting of the NAND gates G113 and G114 and outputs signals indicating the start or end of the parallel test through a WCBR operation, specifically, changing the /CAS signal and the WE signal from "H" to "L" prior to the change of the /RAS signal from "H" to "L". However, the test control circuit is not limited to that constitution.

Specifically, a region X enclosed by the broken line of FIG. 26 is replaced by a constitution shown in FIG. 30, a test control circuit TC2, and the input signals may be supplied at the timings shown in FIG. 31(a)–FIG. 31(f).

In FIG. 30, the test control circuit TC2 has a signal input circuit N1 consisting of inverters G130 to G134 and a NAND gate G135, a signal input circuit N2 consisting of inverters G140 to G144 and a NAND gate G145, a signal input circuit N3 consisting of inverters G150 to G154 and a NAND gate G155, a signal input circuit N4 consisting of inverters G160 to G164 and a NAND gate G165, a signal input circuit N5 consisting of inverters G170 to G174 and a NAND gate G175, a five-input NAND gate G180 to which the signal input circuits N1 to N5 are connected and an inverter G181 for inverting an output of the five-input NAND gate G180.

In the signal input circuit N1, the /RAS signal is inputted through the inverters G130 to G133 to the NAND gate G135 and on the other hand the /RAS signal is inverted through the inverter G130 and inputted to the NAND gate G135, and an output of the NAND gate G135 is inverted by the inverter G134 to be outputted.

In the signal input circuit N2, the /CAS signal is inputted through the inverters G140 to G143 to the NAND gate G145 and on the other hand the /CAS signal is inverted through the inverter G140 and inputted to the NAND gate G145, and an output of the NAND gate G145 is inverted by the inverter G144 to be outputted.

In the signal input circuit N3, the /WE signal is inputted through the inverters G150 to G153 to the NAND gate G155 and on the other hand the /WE signal is inverted through the inverter G150 and inputted to the NAND gate G155, and an output of the NAND gate G155 is inverted by the inverter G154 to be outputted.

In the signal input circuit N4, the /OE signal is inputted through the inverters G160 to G163 to the NAND gate G165 and on the other hand the /OE signal is inverted through the inverter G160 and inputted to the NAND gate G165, and an output of the NAND gate G165 is inverted by the inverter G164 to be outputted.

In the signal input circuit N5, the signal which is applied to the DQ pin DQ<3> is inputted through the inverters G170 to G173 to the NAND gate G175 and on the other hand the signal which is applied to the DQ pin DQ<3> is inverted through the inverter G170 and inputted to the NAND gate G175, and an output of the NAND gate G175 is inverted by the inverter G174 to be outputted. Furthermore, the constitution other than that shown in FIG. 30 is the same as that of the test control circuit TC1 and redundant discussion and illustration will be omitted.

Having this constitution, the test control circuit TC2 outputs the signal indicating the start or end of the parallel test by simultaneously changing the /RAS signal, the /CAS signal, the /WE signal, the /OE signal and the signal which is applied to the DQ pin DQ<3> from "H" to "L", as shown in FIG. 31(a)–FIG. 31(f).

Thus, since the parallel test can not start or end until all of the /RAS signal, the /CAS signal, the /WE signal, the /OE signal and the signal applied to the DQ pin DQ<3> are supplied, this constitution produces an effect of preventing the parallel test from being conducted without any one of these signals.

While the invention has been shown and described in detail, the foregoing description is in all aspects illustrative and not restrictive. It is therefore understood that numerous modifications and variations can be devised without departing from the scope of the invention.

I claim:

1. A semiconductor device for writing and reading plural data in plural memory cells which are specified by the same address signal through a plurality of pairs of input and output wires, comprising:

a plurality of terminals, a plurality of write means connected to said plurality of terminals respectively for writing write data in said plural of memory cells through said plurality of pairs of input and output wires, a plurality of read means for reading data from said plural memory cells through said plurality of pairs of input and output wires, a plurality of output means connected between said plurality of terminals and said plurality of read means respectively, for outputting a plurality of read data read out by said plurality of read means to said plurality of terminals, a mode setting means for outputting test mode signal, degenerating means for generating a first signal indicating that said read data connected to the said degenerating means are all at the first state, for generating a second signal indicating that said read data connected to the said degenerating means are all at the second state, for generating a third signal indicating that said read data connected to said degenerating means include read data at the first state and the second state, comparative means connected to said degenerating means and a terminal which is one of said plurality of terminals, for comparing the output of said degenerating means with the expected data from said terminal, test result outputting means generating a fourth signal by checking said third signal of said degenerating means and the result of comparison of said comparative means, responsive to said test mode signal of said mode setting means.

2. A semiconductor memory of device of claim 1 comprising, wherein said output means comprise buffer circuit which are set in high impedance state, at the time of input of said expected data from outside through said terminal that is connected to said buffer circuit responsive to said test mode signal of said mode setting means.

3. A semiconductor memory device of claim 1, wherein said comparative result hold means comprises:

a first hold means for holding a fifth state at the beginning of said test mode and holding a sixth state after said fourth signal of said test result outputting means indicates the incorrectness of write and read action, and at least until the end of the test mode, and a second hold means for holding the state of said first hold means at a prescribed timing in non-volatile manner.

4. A semiconductor memory device of claim 3, wherein said second hold means has a seventh state and an eighth state, having said seventh state at the time of production and changes to said eighth state receiving said fifth state of said first holding means at said prescribed timing.

5. A semiconductor memory device of claim 4, wherein said second hold means includes a fuse element and a switch means interposed in series in a route between a signal input pin which is supplied with a first potential and a second potential, and said switch means has a control electrode connected to the output of said test result outputting means, said switch means becomes conductive when said first holding means hold said fifth state at said prescribed timing so that a voltage applied to said signal input pin flows a current melting said fuse element.

6. A semiconductor memory device of claim 5, wherein said first potential is higher than power source potential, wherein said signal input pin is an address input pin, said semiconductor memory device further comprising an address buffer connected to said address input pin, for passing an address signal inputted from said address input pin during ordinary action, wherein said address buffer includes a first MOS transistor of a first conductivity type having one electrode connected to said address input pin and a gate electrode connected to said address input pin, a second MOS transistor of a second conductivity type having one electrode connected to the other electrode of said first MOS transistor and a gate electrode connected to said address input pin, a third MOS transistor of the second conductivity type having one electrode connected to the other electrode of said second MOS transistor and the other electrode applied with said second potential, and a fourth MOS transistor of the first conductivity type having one electrode applied with said power source potential and the other electrode connected to the other electrode of said first MOS transistor, wherein a potential at the other electrode of said first MOS transistor is brought into said power source potential by making said third MOS transistor non-conducting and said fourth MOS transistor conducting when said fuse element is melted.

\* \* \* \* \*

UNITED STATES PATENT AND TRADEMARK OFFICE
CERTIFICATE OF CORRECTION

PATENT NO. : 5,724,366
DATED : March 3, 1998
INVENTOR(S): Kiyohiro FURATANI

It is certified that error appears in the above-identified patent and that said Letters Patent is hereby corrected as shown below:

On the title page, Item [63], the Related U.S. Application Data has been listed incorrectly. It should read:

--[63] Continuation-in-part of Ser. No. 551,484, Nov. 1, 1995, Pat. No. 5,642,317.--

Signed and Sealed this

Eighth Day of December, 1998

Attest:

BRUCE LEHMAN

Attesting Officer

Commissioner of Patents and Trademarks